(12) United States Patent
Kobayashi et al.

(10) Patent No.: US 8,119,426 B2
(45) Date of Patent: Feb. 21, 2012

(54) METHOD OF MANUFACTURING AN ULTRASONIC TRANSDUCER SEMICONDUCTOR DEVICE

(75) Inventors: Takashi Kobayashi, Higashimurayama (JP); Shuntaro Machida, Kokubunji (JP); Kunio Hashiba, Tokyo (JP)

(73) Assignee: Hitachi, Ltd., Tokyo (JP)

(*) Notice: Subject to any disclaimer, the term of this patent is extended or adjusted under 35 U.S.C. 154(b) by 0 days.

(21) Appl. No.: 12/999,478

(22) PCT Filed: Jun. 5, 2009

(86) PCT No.: PCT/JP2009/060377
§ 371 (c)(1),
(2), (4) Date: Dec. 16, 2010

(87) PCT Pub. No.: WO2009/154091
PCT Pub. Date: Dec. 23, 2009

(65) Prior Publication Data
US 2011/0086443 A1    Apr. 14, 2011

(30) Foreign Application Priority Data
Jun. 17, 2008  (JP) .................................. 2008-157453

(51) Int. Cl.
*H01L 21/66* (2006.01)
*H01L 21/00* (2006.01)
(52) U.S. Cl. ................ 438/14; 438/17; 438/33; 438/53; 257/E21.529
(58) Field of Classification Search ...................... 438/14, 438/17, 33, 53; 257/E21.529
See application file for complete search history.

(56) References Cited

U.S. PATENT DOCUMENTS

| 6,271,620 | B1 | 8/2001 | Ladabaum |
| 7,411,260 | B2 | 8/2008 | Enomoto et al. |
| 7,512,038 | B2 | 3/2009 | Machida et al. |
| 7,667,374 | B2 | 2/2010 | Aono et al. |
| 7,736,985 | B2 | 6/2010 | Enomoto et al. |
| 7,778,113 | B2 | 8/2010 | Machida et al. |
| 2002/0025587 | A1 | 2/2002 | Wada |
| 2004/0012081 | A1 | 1/2004 | Kwon |
| 2004/0119153 | A1* | 6/2004 | Karnezos ..................... 257/686 |
| 2008/0003770 | A1 | 1/2008 | Enomoto et al. |

(Continued)

FOREIGN PATENT DOCUMENTS
JP        2002-016212 A     1/2002
(Continued)

*Primary Examiner* — Kevin Parendo
(74) *Attorney, Agent, or Firm* — Miles & Stockbridge P.C.

(57) ABSTRACT

A manufacturing yield of a semiconductor device (capacitive micromachined ultrasonic transducer) is increased. A plurality of first chips 1 in which a plurality of cells each having functions of transmitting and receiving ultrasonic waves are formed on a front surface of a first semiconductor wafer are manufactured, and each of the first chips 1 is judged as a superior/inferior product, and then, the first semiconductor wafer is sigulated into a plurality of first chips 1. Next, a plurality of second chips 2 in which a wiring layer is formed on a front surface of a second semiconductor wafer are manufactured, and each of the second chips 2 is judged as a superior/inferior product, and then, the second semiconductor wafer is sigulated into a plurality of second chips 2. Next, the plurality of first chips 1 judged as the superior product are adjacently arranged on the front surface of the second chip 2 judged as the superior product in plane in a Y direction so that lower electrodes 5 of the adjacent first chips 1 are electrically connected with each other via a through electrode 6, a bump 8, and a wiring layer 7.

17 Claims, 29 Drawing Sheets

U.S. PATENT DOCUMENTS

| | | |
|---|---|---|
| 2008/0067895 A1 | 3/2008 | Adachi et al. |
| 2008/0079099 A1* | 4/2008 | Enomoto et al. ............. 257/415 |
| 2008/0277661 A1* | 11/2008 | Machida et al. ................ 257/48 |
| 2010/0200977 A1* | 8/2010 | Sasaki et al. ................. 257/690 |

FOREIGN PATENT DOCUMENTS

| | | |
|---|---|---|
| JP | 2004-056147 A | 2/2004 |
| JP | 2006-333952 A | 12/2006 |
| JP | 2008-006553 A | 1/2008 |

* cited by examiner

METHOD OF MANUFACTURING AN ULTRASONIC TRANSDUCER SEMICONDUCTOR DEVICE

TECHNICAL FIELD

The present invention relates to a method of manufacturing a semiconductor device, and more particularly, the present invention relates to a technique effectively applied to a method of manufacturing a semiconductor chip having a relatively large area in which a cell array is arranged in matrix, such as an ultrasonic transducer.

BACKGROUND ART

An ultrasonic transducer is used for, for example, a diagnostic apparatus for a tumor inside a human body or others. Conventionally, an ultrasonic transducer mainly using vibration of a piezoelectric body is used. However, as a MEMS (Micro Electro Mechanical System) technique has been developed in recent years, a capacitive micromachined ultrasonic transducer (CMUT) has been currently developed, in which a vibrating portion having a structure that a hollow portion is sandwiched between upper- and lower-layer electrodes is formed on a silicon substrate.

The CMUT has advantages such as a wider usable ultrasonic frequency band than that of the transducer using the piezoelectric body or high resolution. Also, since the CMUT is manufactured by using LSI (Large Scale Integration) process techniques, the CMUT can be microfabricated. More particularly, it is considered that the CMUT is essential for arranging one ultrasonic element in array and independently controlling each ultrasonic element. The reason is that, while the number of wires in a cell array is very large because a wire is required for each ultrasonic element, the wires in the CMUT are simply formed because the CMUT is manufactured by using the LSI process technique. Also, the reason is that, in the CMUT, a processing circuit for signals from an ultrasonic transmitting/receiving unit can be embedded on one semiconductor chip.

The technique for the ultrasonic transducer is disclosed in, for example, U.S. Pat. No. 6,271,620B1 (Patent Document 1).

PRIOR ART DOCUMENT

Patent Document
  Patent Document 1: U.S. Pat. No. 6,271,620B1

DISCLOSURE OF THE INVENTION

Problems to be Solved by the Invention

According to studies made by the present inventors, in the CMUT, various technical problems as described below have been found out.

A basic structure of the CMUT studied by the present inventors and operation thereof are described with reference to FIGS. 29 to 31. FIG. 29 is a cross-sectional view of a principal part of one ultrasonic element (hereinafter, written as CMUT cell) forming the CMUT studied by the present inventors, FIG. 30 is a plan view of a principal part illustrating a whole semiconductor chip mounting the CMUT studied by the present inventors, and FIG. 31 is a plan view of a principal part illustrating an enlarged part (connecting portion) of the CMUT studied by the present inventors.

As illustrated in FIG. 29, a lower electrode 103 of the CMUT cell is formed on an upper layer of a first insulating film 102 formed on a surface of a semiconductor substrate 101. A hollow portion 105 is formed on an upper layer of the lower electrode 103 through a second insulating film 104, a third insulating film 106 is formed so as to surround the hollow portion 105, and an upper electrode 107 is formed on an upper layer of the third insulating film 106. Also, a fourth insulating film 108 and a fifth insulating film 109 are sequentially formed on an upper layer of the upper electrode 107.

Further, a pad opening portion (whose illustration is omitted) reaching the lower electrode 103 is formed in the second, third, fourth, and fifth insulating films 104, 106, 108, and 109 in a region where the hollow portion 105 and the upper electrode 107 are not formed, so that voltage can be supplied to the lower electrode 103 through the pad opening portion. Still further, a pad opening portion (whose illustration is omitted) reaching the upper electrode 107 is formed in the fourth and fifth insulating films 108 and 109, so that voltage can be supplied to the upper electrode 107 through the pad opening portion. A membrane "M" vibrated in driving the CMUT is configured with the third insulating film 106, the upper electrode 107, and the fourth and fifth insulating films 108 and 109 formed thereon.

Next, operations for transmitting and receiving ultrasonic waves are described. When alternating voltage and direct voltage are superimposed with each other between the upper electrode 107 and the lower electrode 103, electrostatic force functions between the upper electrode 107 and the lower electrode 103, so that the membrane M is vibrated by frequency of the applied alternating voltage to transmit the ultrasonic waves.

On the other hand, when the ultrasonic waves are received, the membrane M is vibrated by pressure of the ultrasonic waves reaching a surface of the membrane M. A distance between the upper electrode 107 and the lower electrode 103 is changed by the vibration, and therefore, the ultrasonic waves can be detected as change of electric capacitance between the upper electrode 107 and the lower electrode 103. That is, by change of the distance between the upper electrode 107 and the lower electrode 103, the electric capacitance between the upper electrode 107 and the lower electrode 103 is changed, so that current is flown. By detecting the current, the ultrasonic waves can be detected.

As illustrated in FIGS. 30 and 31, in the CMUT, the predetermined plural number of CMUT cells "C" are arranged in array having a first direction (X direction) and a second direction (Y direction) right crossing the first direction to form a unit called block "B". Further, the predetermined plural number of blocks B are arranged in array having the first direction (X direction) and the second direction (Y direction) to form one semiconductor chip 110. A length of the semiconductor chip 110 in a longitudinal direction (second direction (Y direction)) is determined by the number of the upper electrode 107 and a pitch "d" between the blocks B. The pitch d is, for example, about half a wavelength "λ" of transmitting sound of the CMUT cell C.

Also, in order to decrease an area of the semiconductor chip 110 with securing sufficient transmitting-sound pressure, a planar shape of the CMUT cell C is normally a hexagonal shape. Also, in order to arrange the CMUT cell C in high density, the CMUT cell C is arranged in a honeycomb structure. When the CMUT is used for diagnosis for a portion relatively close to a body surface such as carotid artery and thyroid gland, a frequency region of, for example, about 5 to 10 MHz is used. In this case, a diameter of an inscribed circle of the hexagonal CMUT cell C is set to, for example, about 50 μm. One block B is configured by arranging four pieces of the CMUT cells in the longitudinal direction (second direction (Y direction)) and eight pieces of the CMUT cells in a shorter direction (first direction (X direction)) (in FIG. 31, the number of cells in one block B is simply expressed as 4×4). The semiconductor chip 110 is configured by arranging 192 pieces of the blocks B in the second direction (Y direction) and 16 pieces thereof in the first direction (X direction). Note that a unit formed by arranging 16 pieces of the blocks B in the first direction (X direction) is called an upper electrode channel or an upper electrode wire, and a unit formed by arranging 192 pieces of the blocks B in the second direction (Y direction) is called a lower electrode channel or a lower electrode wire sometimes. In the upper electrode channel, 512 pieces of CMUT cells C which is expressed by a formula "4×8×16=512" are provided. The area of the semiconductor chip 110 is, for example, 4 cm×1 cm.

When the CMUT is used for diagnosis for a deep portion relatively away from a body surface such as circulatory organ, viscera, and an unborn child, a frequency region of, for example, about 3 MHz is used. In this case, the diameter of the inscribed circle of the hexagonal CMUT cell C is set to, for example, about 75 μm, and this is larger than the diameter of the inscribed circle of the CMUT cell C used in the above-described frequency region of about 5 to 10 MHz. Therefore, when the array arrangement of 192 columns×16 columns is provided similarly to the case of the above-described frequency region of about 5 to 10 MHz, the area of the semiconductor chip 110 is, for example, 6 cm×1.5 cm.

Incidentally, in such a semiconductor chip having a relatively large area, a problem such as yield decrease arises. Generally, between the area "A" of the semiconductor chip and the yield "Y", a following correlation is formed.

$$Y=\exp(-DA) \qquad \text{Formula (1)}$$

Here, a symbol "D" represents defect density, and a symbol "A" represents the area of the semiconductor chip. From the Formula (1), when the defect density is constant, the yield is decreased exponentially with increasing the area of the semiconductor chip. In the CMUT, the ultrasonic waves are transmitted and received by using the vibration of the membrane caused by the static force due to applying the voltage between the upper electrode and the lower electrode and the change of the electric capacitance between the upper electrode and the lower electrode caused by the vibration. Generally, when the direct voltage and the alternative voltage are combined with each other, the voltage applied between the upper electrode and the lower electrode is as high as 100 V or higher, and therefore, it is required to particularly consider the yield decrease caused by the defect density of the insulating films (such as the second insulating film 104 and the third insulating film 106 illustrated in FIG. 29) between the upper electrode and the lower electrode.

As a method of increasing the yield of the semiconductor chip having the relatively large area, a CSP (Chip Size Package) technique is cited. This technique is for formation of a combined chip by adjacently adhering a plurality of semiconductor chips panned as the superior product. The semiconductor chips are connected to each other by, for example, bridge wiring. In the CSP technique, each of the connected semiconductor chips has a peripheral circuit. Therefore, even if each semiconductor chip is independent, it can be operated.

On the other hand, in the CMUT, as described above, the semiconductor chip is formed by only the cell array. Therefore, in order to apply the CSP technique to the cell array of the CMUT, it is required to further divide the semiconductor chip in the cell array. In the CSP technique, the combined chip is formed by mounting a semiconductor chip having a plurality of cell arrays in some cases, such as a DRAM (Dynamic Random Access Memory). However, anything about the division of the semiconductor chip in the cell array or cutting thereof has not been described so far.

A preferred aim of the present invention is to provide a technique capable of increasing yield of manufacturing a semiconductor device (capacitive micromachined ultrasonic transducer).

The above and other preferred aims and novel characteristics of the present invention will be apparent from the description of the present specification and the accompanying drawings.

Means for Solving the Problems

The typical ones of the inventions disclosed in the present application will be briefly described as follows.

This embodiment is for a method of manufacturing a capacitive micromachined ultrasonic transducer. First, a plurality of first chips each having a relatively small area are manufactured on a surface of a semiconductor wafer, the first chip on which a plurality of CMUT cells each having a function of transmitting/receiving ultrasonic wave are formed. After judging superior/inferior product for each first chip, the semiconductor wafer is diced to be the plurality of first chips. Next, a plurality of second chips each having a relatively large area are manufactured on the surface of the semiconductor wafer, the second chip on which a wiring layer is formed. After judging superior/inferior product for each second chip, the semiconductor wafer is diced to be the plurality of second chips. Next, through electrodes exposed on rear surfaces of the adjacent first chips are electrically connected with each other through the wiring layer formed on the surface of the second chip, so that the plurality of first chips judged as the superior product are adjacently arranged on the surface of the second chip judged as the superior product in a second direction in plane.

Effects of the Invention

The effects obtained by typical aspects of the present invention disclosed in the present application will be briefly described below.

The yield of manufacturing the semiconductor device (capacitive micromachined ultrasonic transducer) can be increased.

BRIEF DESCRIPTIONS OF THE DRAWINGS

FIGS. 1A to 1C are plan views of principal parts explaining a capacitive micromachined ultrasonic transducer according to a first embodiment of the present invention, FIG. 1A is the plan view of the principal part illustrating a whole combined chip, FIG. 1B is the plan view of the principal part illustrating a whole first chip, and FIG. 1C is the plan view of the principal part illustrating a whole second chip;

Figure 23A:
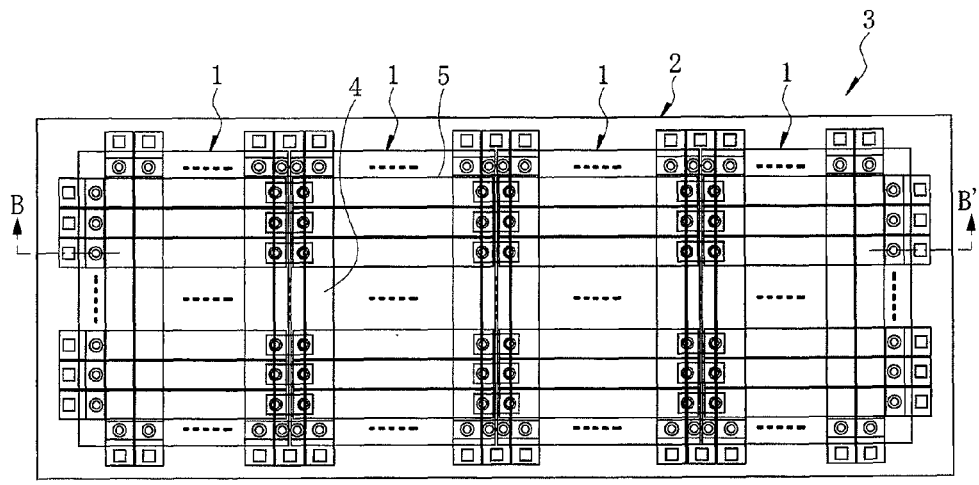
Figure 23B:
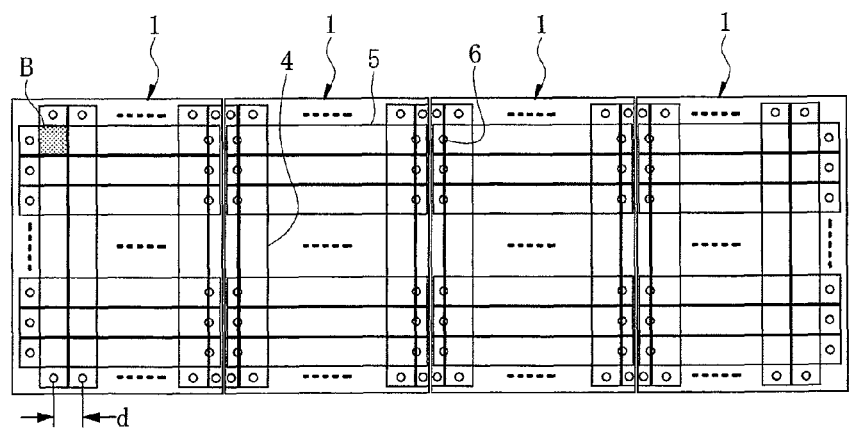
Figure 23C:
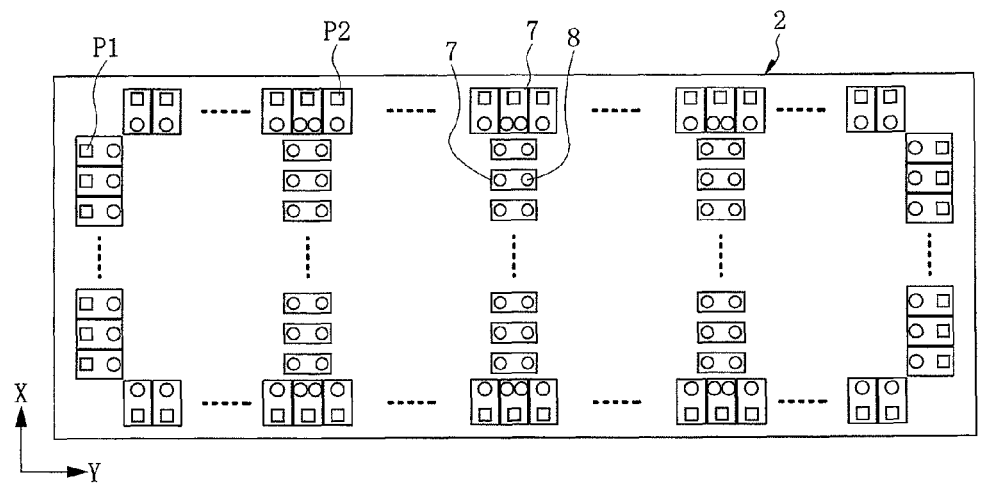
Figure 24:
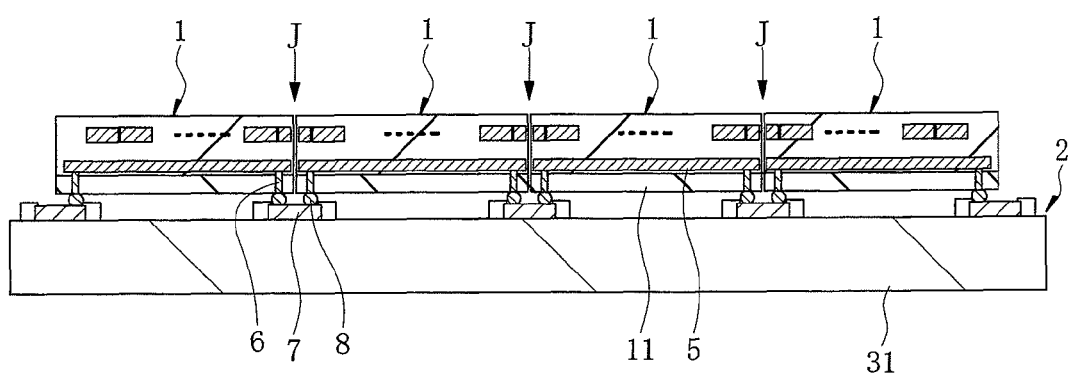
Figure 25A:
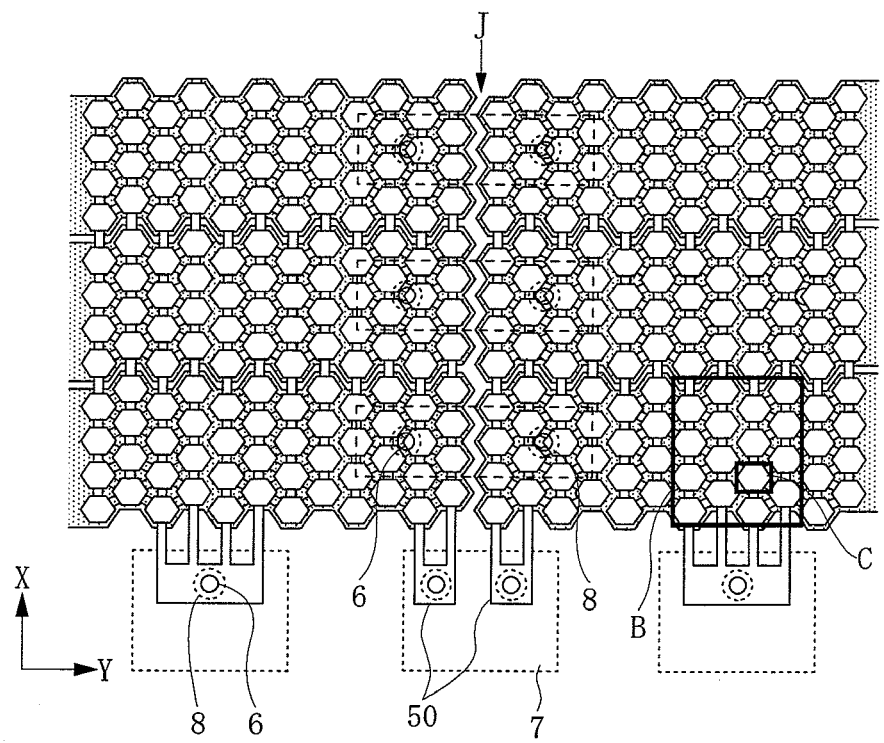
Figure 25B:
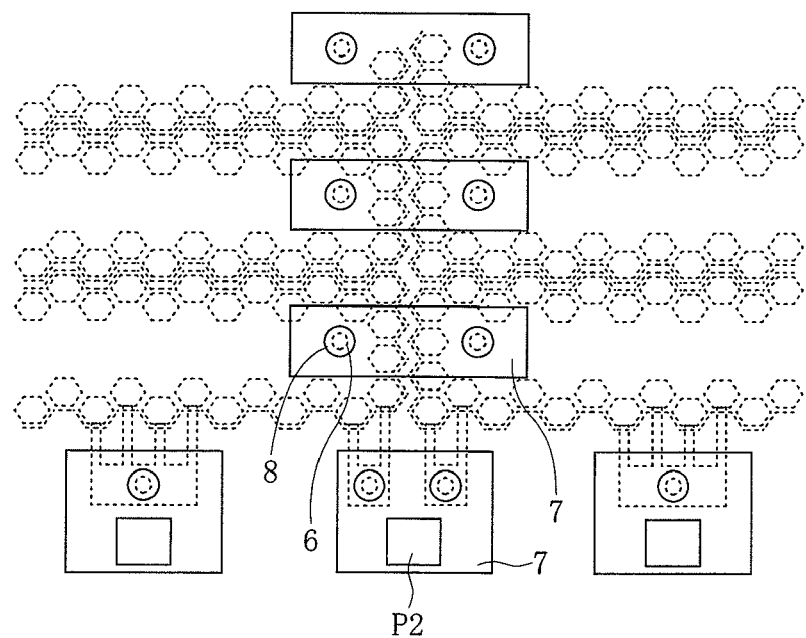
Figure 26A:
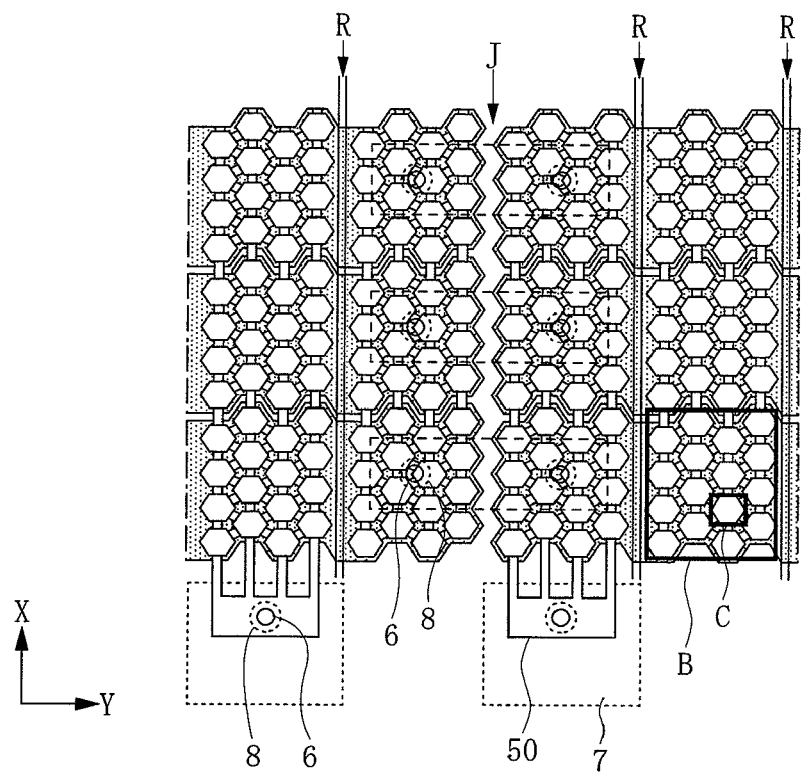
Figure 26B:
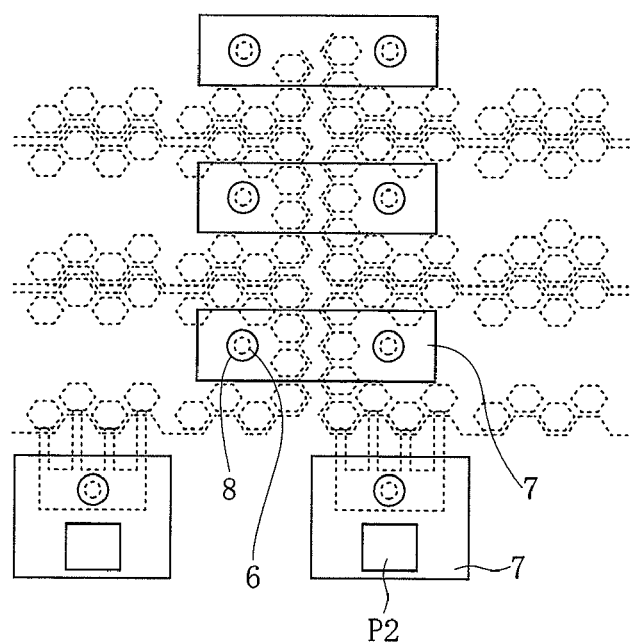
Figure 27A:
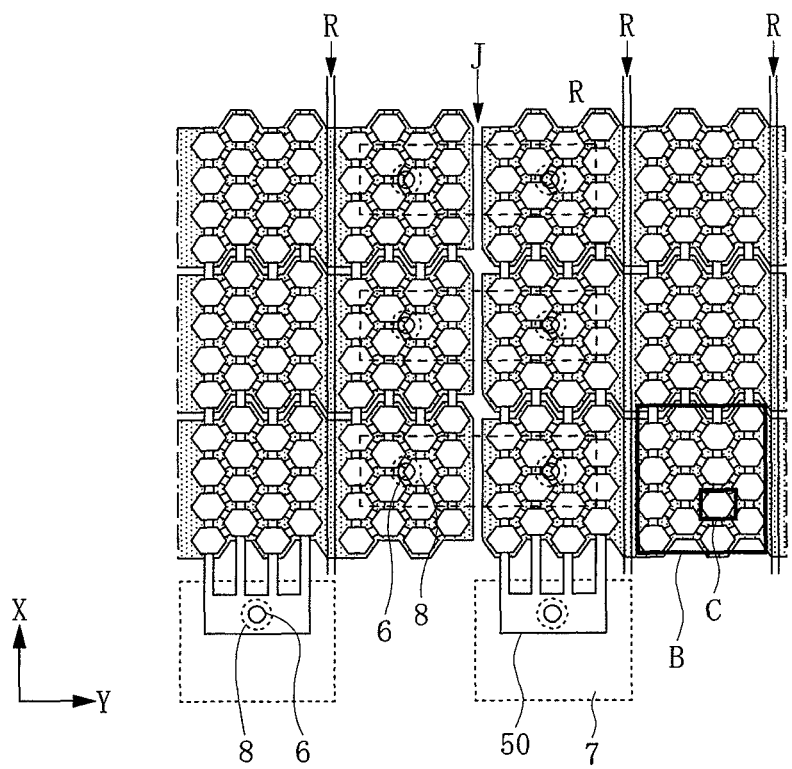
Figure 27B:
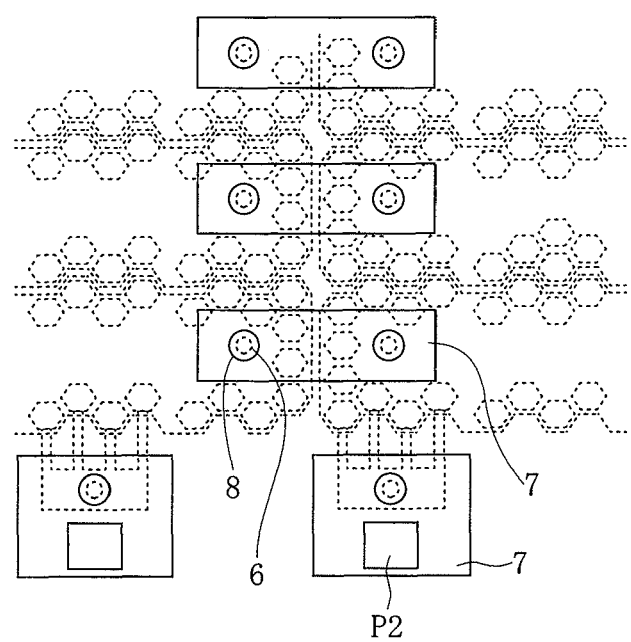
Figure 28A:
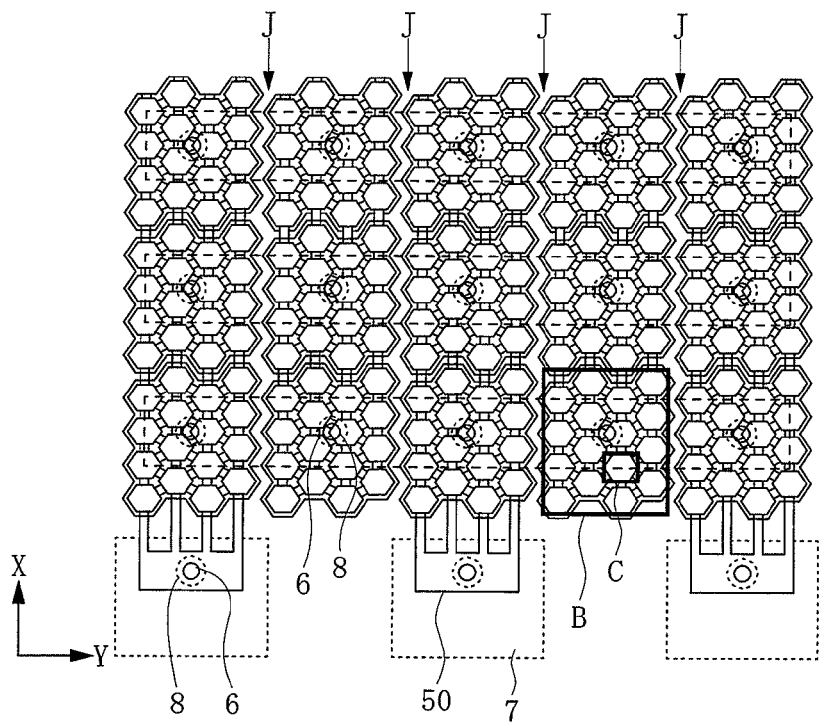
Figure 28B:
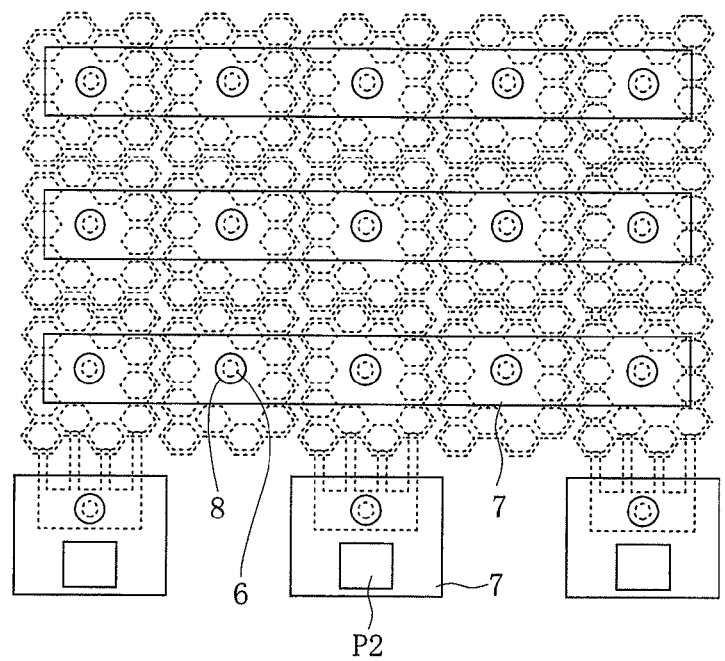
Figure 29:
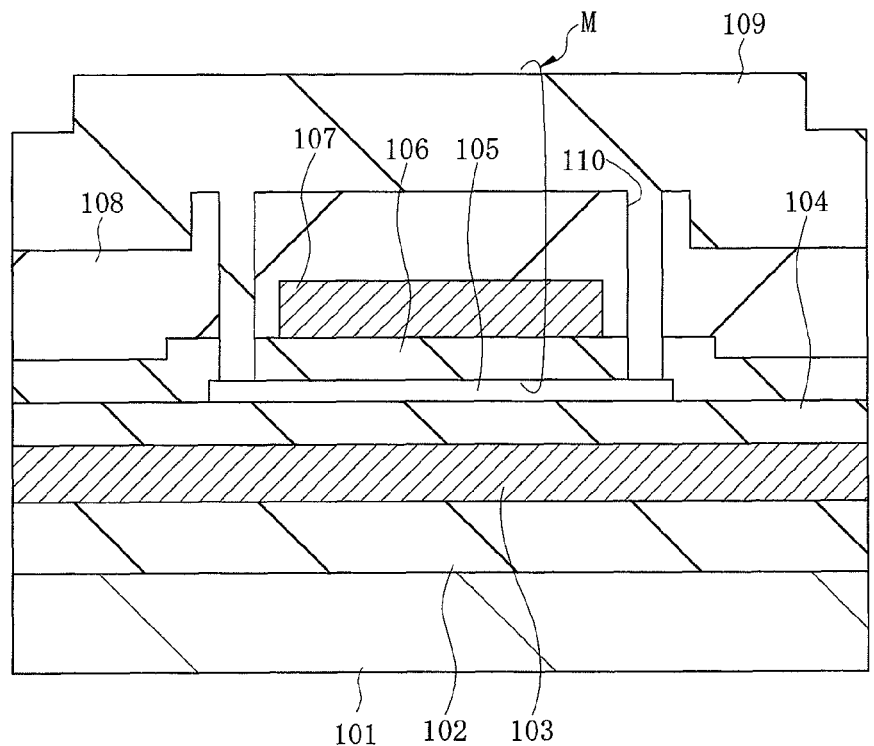
Figure 30:
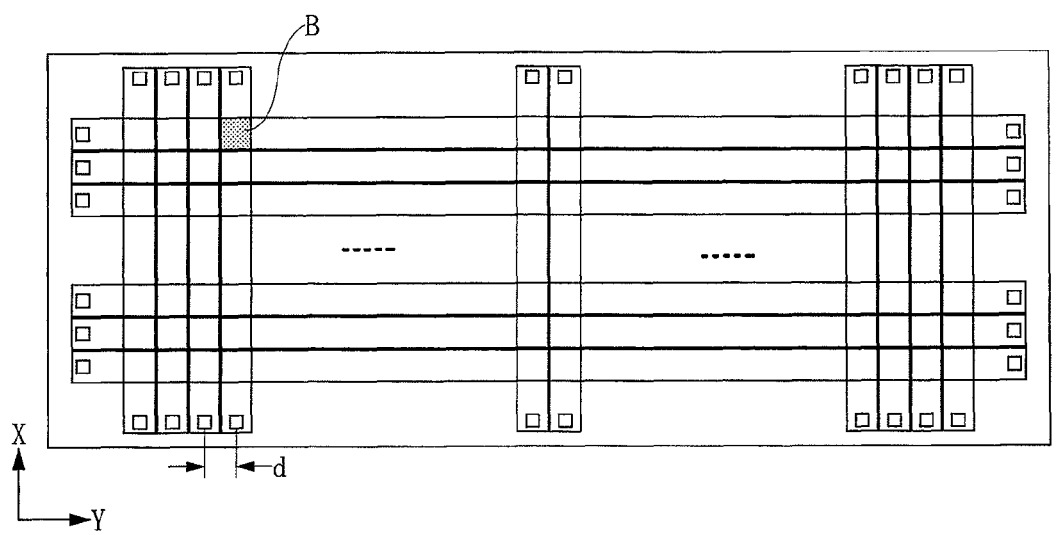
Figure 31:
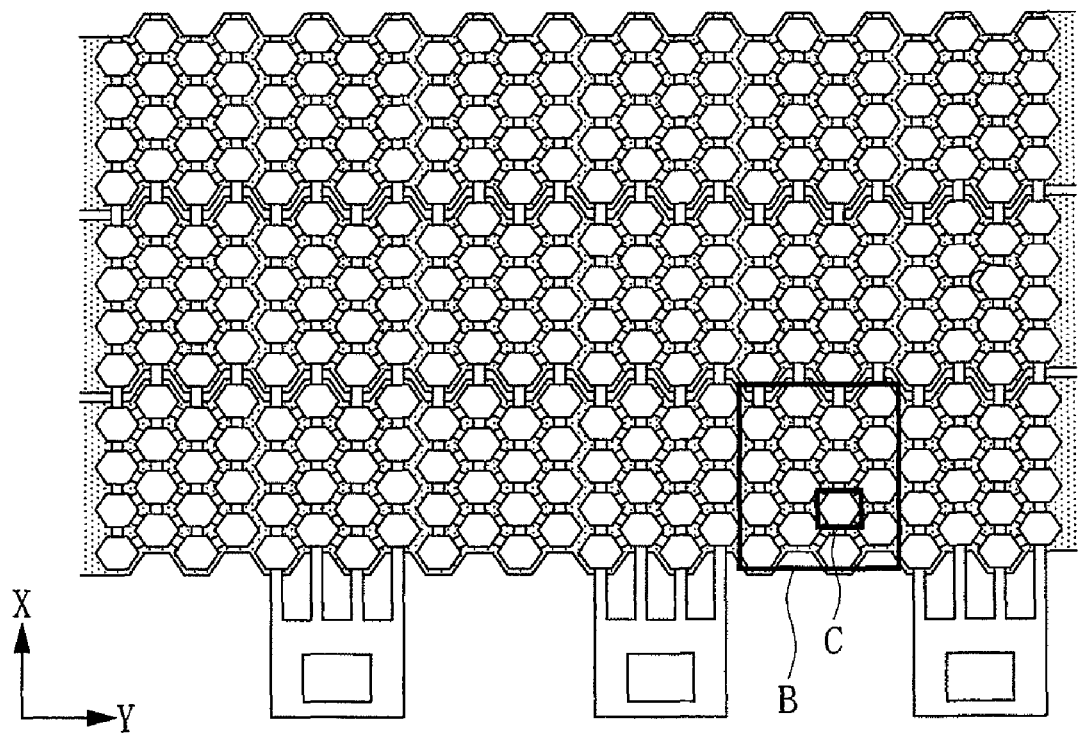

FIGS. 23A to 23C are plan views of principal parts explaining a capacitive micromachined ultrasonic transducer according to a second embodiment of the present invention, FIG. 23A is the plan view of the principal part illustrating a whole combined chip, FIG. 23B is the plan view of the principal part illustrating a whole first chip, and FIG. 23C is the plan view of the principal part illustrating a whole second chip;

FIG. 24 is a cross-sectional view of a principal part taken along line B-B' in FIG. 23A;

FIGS. 25A and 25B are plan views of principal parts illustrating an enlarged part (connecting portion) of the capacitive micromachined ultrasonic transducer according to the second embodiment of the present invention;

FIGS. 26A and 26B are plan views of principal parts illustrating an enlarged part (connecting portion) of a capacitive micromachined ultrasonic transducer of a first example according to a third embodiment;

FIGS. 27A and 27B are plan views of principal parts illustrating an enlarged part (connecting portion) of a capacitive micromachined ultrasonic transducer of a second example according to the third embodiment;

FIGS. 28A and 28B are plan views of principal parts illustrating an enlarged part (connecting portion) of a capacitive micromachined ultrasonic transducer according to a fourth embodiment;

FIG. 29 is a cross-sectional view of a principal part of one ultrasonic element forming a capacitive micromachined ultrasonic transducer studied by the present inventors;

FIG. 30 is a plan view of a principal part illustrating a whole semiconductor chip mounting the capacitive micromachined ultrasonic transducer studied by the present inventors; and FIG. 31 is a plan view of a principal part illustrating an enlarged part of the capacitive micromachined ultrasonic transducer studied by the present inventors.

BEST MODE FOR CARRYING OUT THE INVENTION

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, in some drawings used in the embodiments, hatching is used even in a plan view so as to make the drawings easy to see.

Further, in the following embodiments, the term "wafer" mainly indicates a Si (silicon) single-crystal wafer and it indicates not only the same but also a SOI (silicon on insulator) wafer, an insulating film substrate for forming an integrated circuit thereon, or the like. The shape of the wafer includes not only a circular shape or a substantially circular shape but also a square shape, a rectangular shape, and the like.

Still further, components having the same function are denoted by the same reference symbols throughout the drawings for describing the embodiments, and the repetitive description thereof is omitted. Hereinafter, embodiments of the present invention will be described with reference to the drawings.

First Embodiment

Figure 1A:
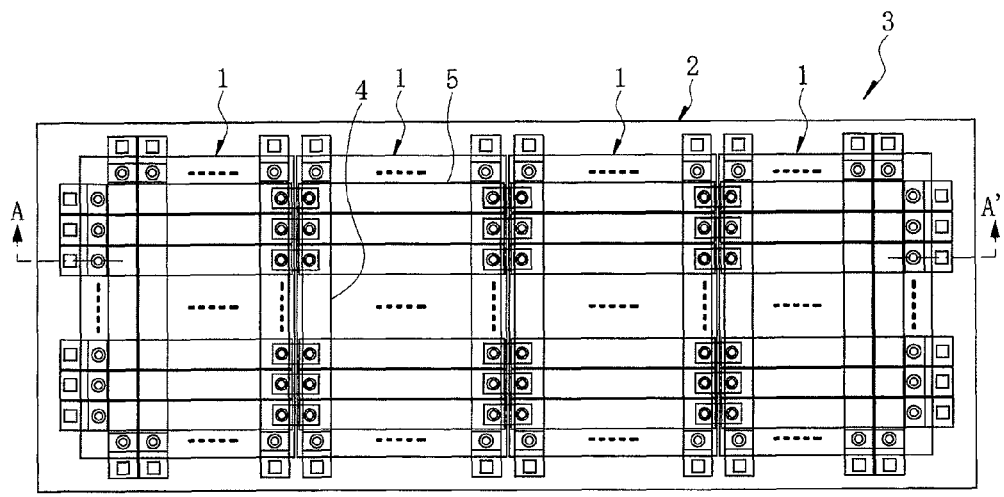

A semiconductor device according to a first embodiment is described with reference to FIGS. 1 to 3. The first embodiment describes a case that the invention made by the present inventors is applied to a capacitive micromachined ultrasonic transducer manufactured by using a MEMS technique which is a used field of a background of the invention. FIGS. 1A, 1B, and 1C are plan views of principal parts each illustrating a whole capacitive micromachined ultrasonic transducer, FIG. 2 is a cross-sectional view of a principal part taken along line A-A' in FIG. 1A, and FIGS. 3A and 3B are plan views of principal parts illustrating an enlarged part (connecting portion) of the capacitive micromachined ultrasonic transducer.

An upper layer of the capacitive micromachined ultrasonic transducer is a first chip 1 (semiconductor chip having a relatively small area) and a lower layer thereof is a second chip 2 (semiconductor chip having a relatively large area), and the capacitive micromachined ultrasonic transducer is formed of a combined chip 3 obtained by stacking the first chip 1 and the second chip 2. FIG. 1A is a plan view of a principal part viewed from a front-surface side of the combined chip obtained by the first chip 1 and the second chip 2, and FIGS. 1B and 1C are plan views of principal parts viewed from front-surface sides of the first chip 1 and the second chip 2, respectively.

Figure 1B:
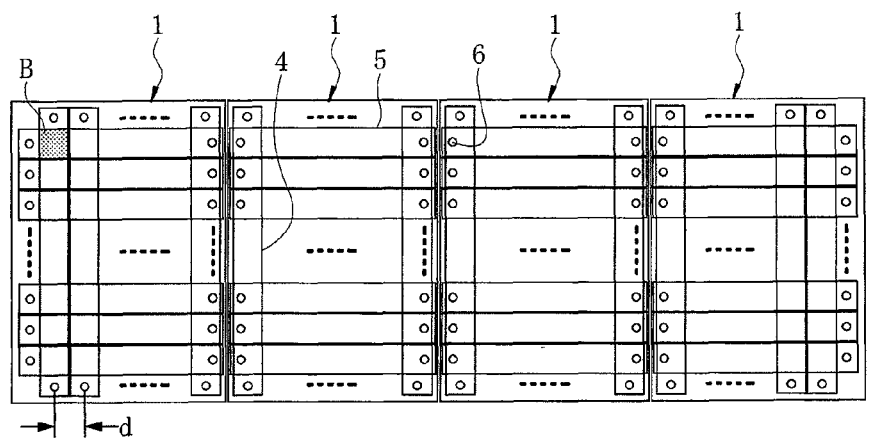
Figure 2:
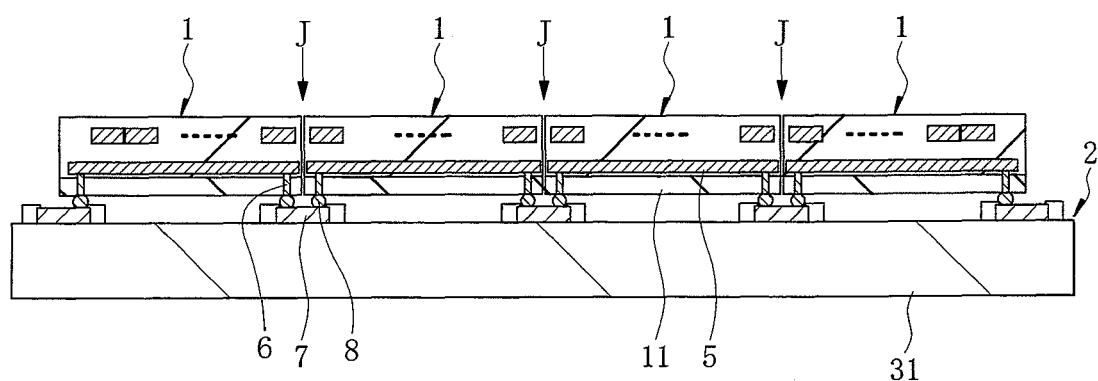
FIG. 2 is a cross-sectional view of a principal part taken along line A-A' in FIG. 1A.

The first chip 1 illustrated in FIG. 1B has a function of transmitting/receiving ultrasonic wave. A cross-point of the upper electrode (the upper electrode wire and the upper electrode channel) 4 and the lower electrode (the lower electrode wire and the lower electrode channel) 5 forms a unit called block "B". A plurality of CMUT cells "C" are arranged in matrix in the block B, and, for example, 8 pieces of CMUT cells are arranged in an X direction (first direction) and 4 pieces of CMUT cells are arranged in a Y direction (second direction) which crosses the X direction. In FIG. 3, the number of the CMUT cells C in one block B is expressed as 4×4 for simplicity. Further, the first chip 1 is formed by a cell array in which 16 pieces of the blocks B are arranged in the X direction and 48 pieces thereof are arranged in the Y direction. Therefore, in the block B (upper electrode 4) extending in the X direction, 512 pieces of the CMUT cells C whose piece number is expressed by "4×8×16=512" exist. Still further, in the first embodiment, 4 pieces of the first chips 1 are adjacently arranged in the Y direction in plane, so that the combined chip 3 having 192 pieces of the blocks B (upper electrode 4) whose piece number is expressed by "48×4=192" in the Y direction is formed. Still further, to each end portion of the blocks B extending in the X direction and the Y direction, a through electrode 6 reaching a rear surface of a substrate of the first chip 1 is connected (although the through electrode 6 is illustrated in the plan view of the principal part viewed from the front side of the combined chip 3 illustrated in FIG. 1A and the plan view of the principal part viewed from the front side of the first chip illustrated in FIG. 1B, it cannot be viewed from the front sides).

Figure 1C:
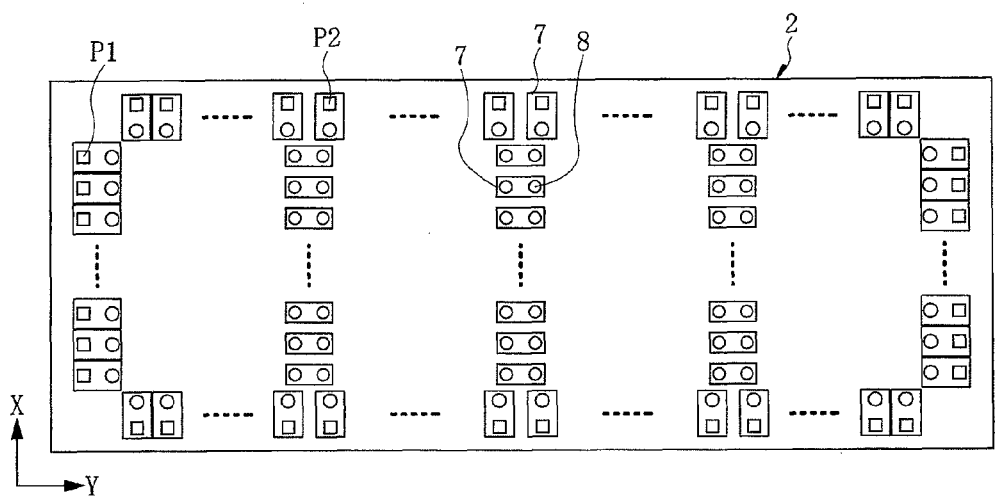

The second chip 2 illustrated in FIG. 1C has a wiring layer 7 for connecting between the lower electrodes 5 positioned at the end portions of the adjacent first chips 1 in the Y direction or pulling wire-bonding pads P1 and P2 out from the end portion of the upper electrode 4 positioned at the end portion of the first chip 1 in the X direction.

As illustrated in FIG. 2, the first chip 1 and the second chip 2 are connected with each other via a bump 8 so that the through electrode 6 formed in the first chip 1 and the wiring layer 7 formed in the second chip 2 are electrically connected with each other. In this manner, the lower electrodes 5 of the first chip 1 are connected with each other in the longitudinal direction (Y direction) by adjacently arranging the plurality of first chips 1, so that they can apparently function as one semiconductor chip having a relatively large area.

Figure 3A:
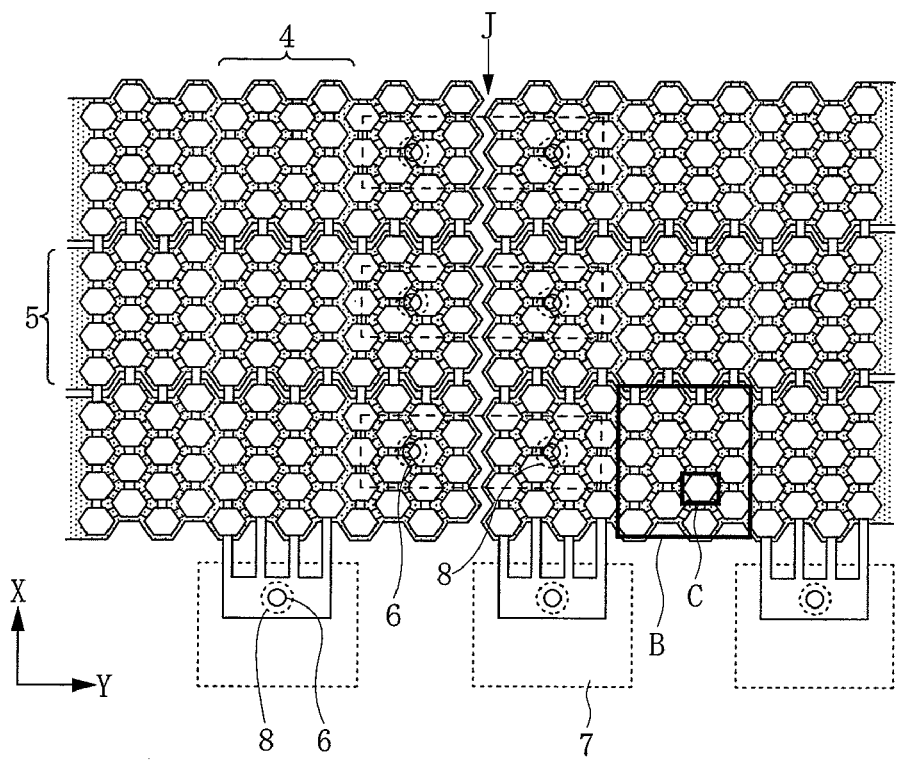
FIGS. 3A and 3B are plan views of principal parts illustrating an enlarged part (connecting portion) of the capacitive micromachined ultrasonic transducer according to the first embodiment of the present invention.
Figure 3B:
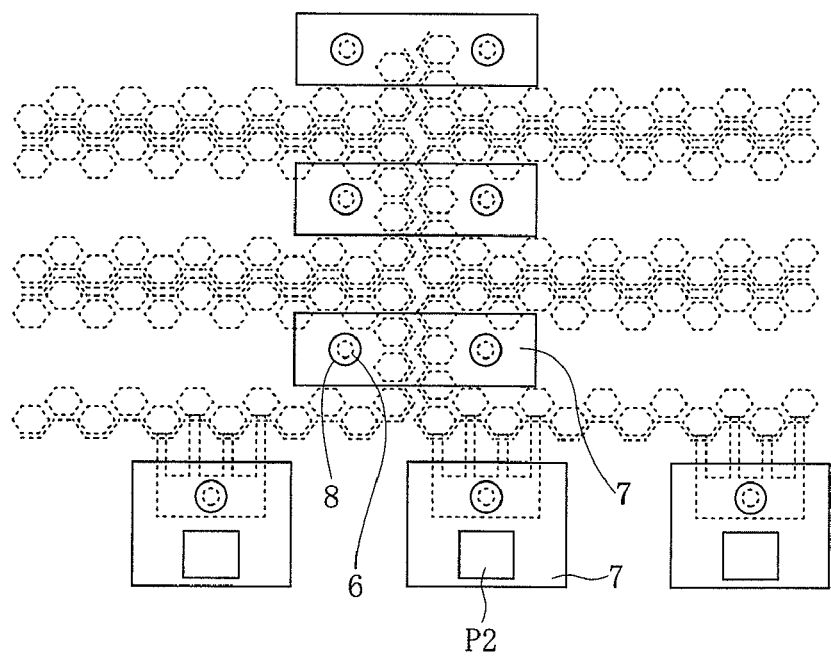

FIGS. 3A and 3B illustrate an enlarged connecting portion of the first chip 1. Here, the number of the CMUT cells C in one block B is expressed as 4×4 pieces for simplicity.

In FIG. 3A, each layer forming the first chip 1 is illustrated by a solid line, and each layer forming the second chip 2 is illustrated by a dashed line. A cutting portion "J" where the lower electrodes 5 extending in the Y direction are cut becomes the connecting portion between the adjacently-arranged first chips 1. Therefore, when they are regarded as one semiconductor chip, while the lower electrodes 5 extending in the Y direction are divided from each other at the cutting portion J, the through electrode 6 reaching the rear surface of the substrate is formed in each lower electrode 5 for connecting the lower electrodes 5 at the cutting portion J. By forming the cutting portion J in a zigzag shape along the hexagonal CMUT cell C, a portion for cutting can be small.

In FIG. 3B, each layer forming the first chip 1 is illustrated by a dashed line, and each layer forming the second chip 2 is illustrated by a solid line. Here, only the CMUT cell C existing at the end portion of the lower electrode 5 is illustrated by the dashed line for simplicity. In order to connect between the adjacent lower electrodes 5 in the longitudinal direction (Y direction), the wire layer 7 is arranged at a corresponding position right below the through electrode 6.

Next, a method of manufacturing the capacitive micromachined ultrasonic transducer according to the first embodiment is described in an order of steps with reference to FIGS. 4A to 19. First, a method of manufacturing the first chip 1 according to the first embodiment is described with reference to the cross-sectional views of the principal parts of the first chip 1 illustrated in FIGS. 4A to 12B.

Figure 4A:
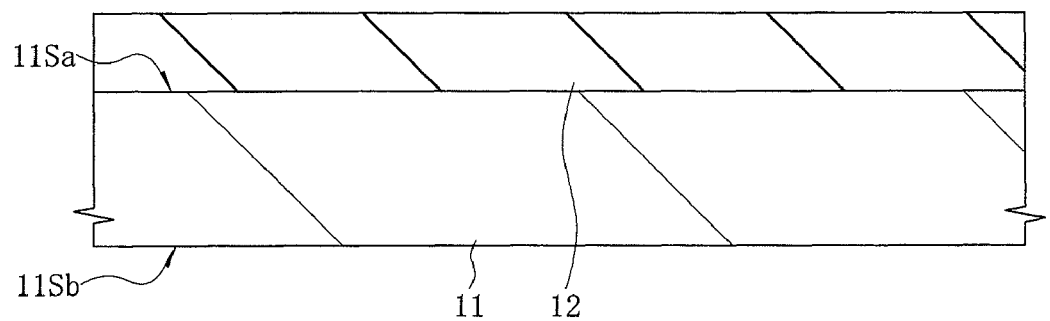
FIGS. 4A and 4B are cross-sectional views of principal parts in a manufacturing step for the capacitive micromachined ultrasonic transducer (first chip) according to the first embodiment of the present invention.

First, as illustrated in FIG. 4A, a semiconductor substrate 11 (a semiconductor thin plate having a planar, substantially round shape called semiconductor wafer at this stage) is prepared. The semiconductor substrate 11 is made of, for example, silicon single crystal, and has a first main surface (upper surface/front surface) 11Sa and a second main surface (lower surface/rear surface) 11Sb positioned opposite to each other along a thickness direction. Substantially, on a whole surface of the first main surface 11Sa of the semiconductor substrate 11, a first insulating film 12 made of, for example, silicon oxide film is formed. A thickness of the first insulating film 12 can be set to, for example, 0.8 μm.

Figure 4B:
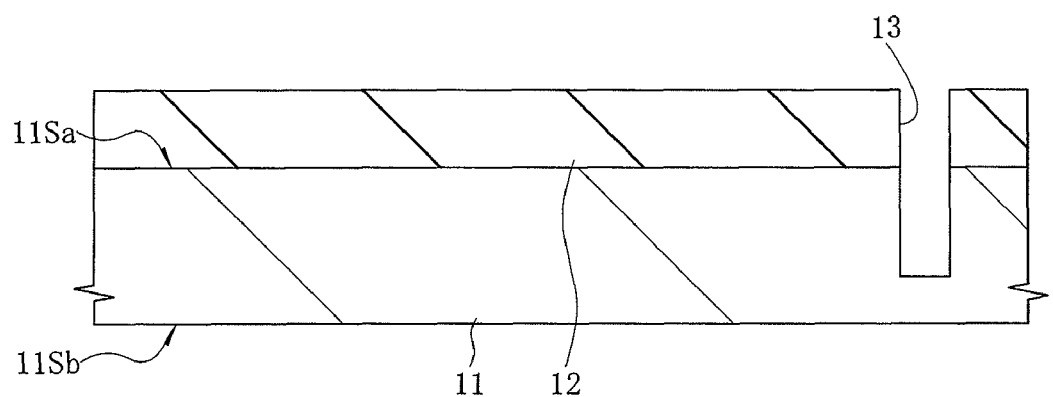

Next, as illustrated in FIG. 4B, a hole 13 having a depth of, for example, 70 μm is formed by anisotropic dry etching from a surface of the first insulating film 12 toward the semiconductor substrate 11.

Figure 5A:
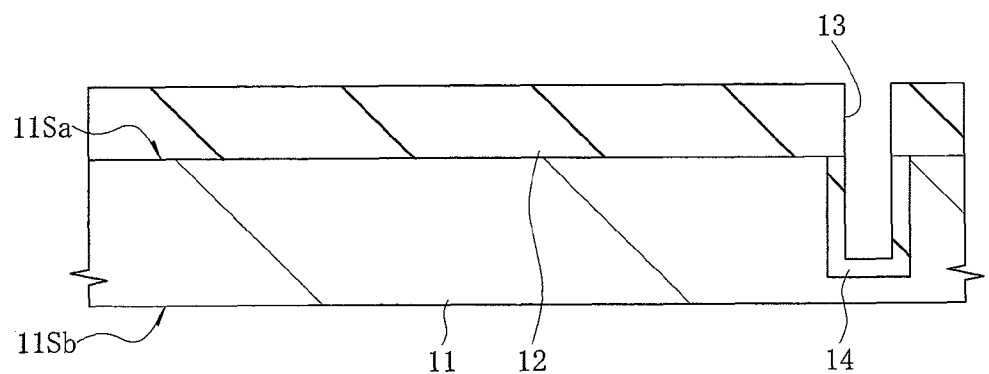
FIGS. 5A and 5B are cross-sectional views of principal parts in a manufacturing step for the capacitive micromachined ultrasonic transducer, continued from FIGS. 4A and 4B.

Next, as illustrated in FIG. 5A, a sidewall of the hole 13 is oxidized by a thermal oxidation method to form a silicon oxide film 14. The silicon oxide film 14 has a function of electrically isolating the semiconductor substrate 11 from a conductive film filled in the hole 13 in a later step.

Figure 5B:
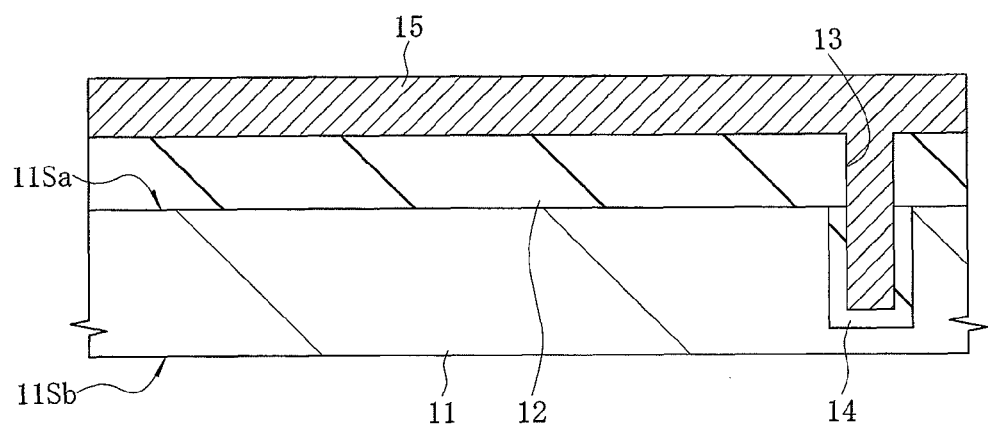

Next, as illustrated in FIG. 5B, on the first insulating film 12 including an inside of the hole 13, a conductive film 15 is formed. The conductive film 15 is made of, for example, an aluminum (Al) film deposited by a sputtering method. The aluminum film is made of a conductive film containing aluminum as a main component, such as a single aluminum film or an aluminum alloy film. Also, as the conductive film 15, in addition to these films, a titanium nitride (TiN) film, a copper (Cu) film, or others can be used. As a method of forming these films, a sputtering method, a CVD (Chemical Vapor Deposition) method, a plating method, or others can be exemplified.

Figure 6A:
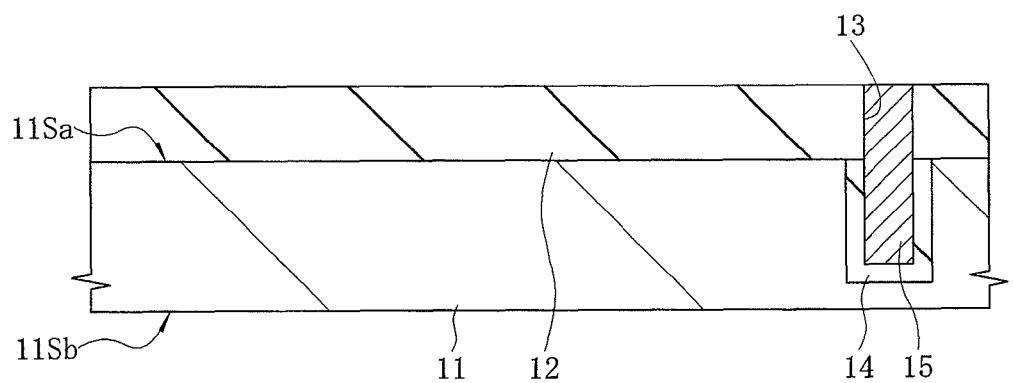
FIGS. 6A and 6B are cross-sectional views of principal parts in a manufacturing step for the capacitive micromachined ultrasonic transducer, continued from FIGS. 5A and 5B.

Next, as illustrated in FIG. 6A, the conductive film 15 is polished by a CMP (Chemical Mechanical Polishing) method to expose the surface of the first insulating film 12 for flattening, so that the inside of the hole 13 is filled by the conductive film 15.

Figure 6B:
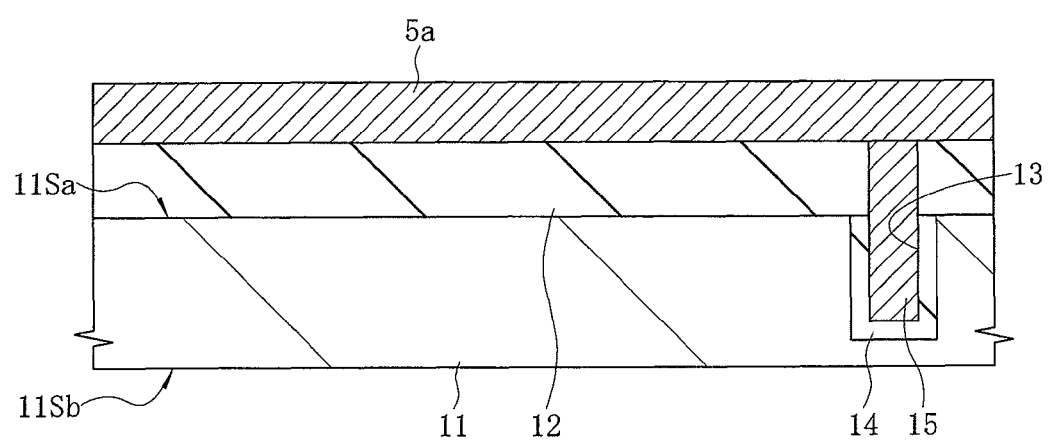

Next, as illustrated in FIG. 6B, on the first insulating film 12 and the conductive film 15, a conductive film 5a for forming the lower electrode is formed. The conductive film 5a is formed on a whole surface of the first main surface 11Sa of the semiconductor substrate 11. The conductive film 5a is made of a metal film or a film having metallic conduction, such as a stacked film formed by a titanium nitride film, an aluminum film, and a titanium nitride film in order from bottom up. The aluminum film is made of a conductive film containing aluminum as a main component, such as a pure aluminum film or an aluminum alloy film. The conductive film 5a can be formed by, for example, a sputtering method. Also, when the conductive film 5a is the stacked film formed by the titanium nitride film, the aluminum film, and the titanium nitride film, the aluminum film is a main conductive film of the lower electrode 5, and therefore, the aluminum film is thicker than the titanium nitride film such that a thickness of the aluminum film is about 0.6 μm, and a thickness of each titanium nitride film above and below the aluminum film is about 0.05 μm. Also, instead of the titanium nitride film, a stacked film formed by a titanium (Ti) film and a titanium nitride film, a tungsten (W) film, or others can be also used.

Figure 7A:
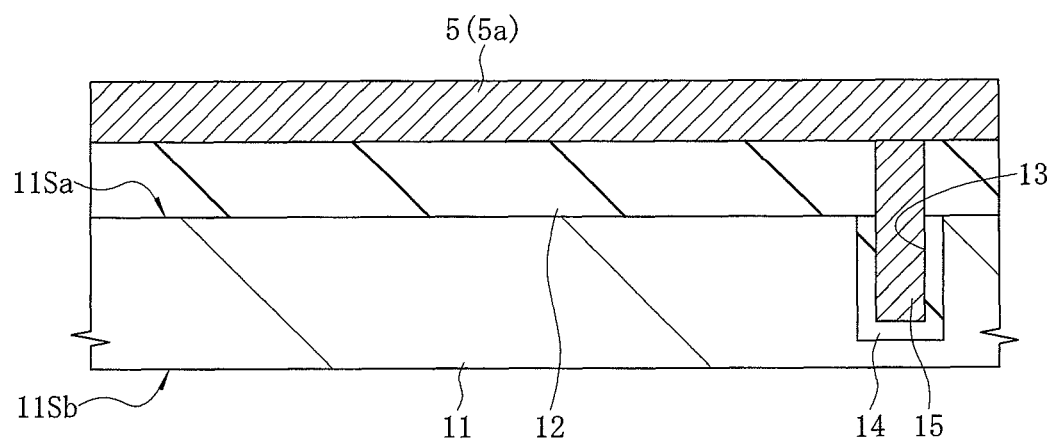
FIGS. 7A and 7B are cross-sectional views of principal parts in a manufacturing step for the capacitive micromachined ultrasonic transducer, continued from FIGS. 6A and 6B.

Next, as illustrated in FIG. 7A, the conductive film 5a is patterned by using, for example, a lithography method and a dry etching method. By the patterned conductive film 5a, the lower electrode 5 is formed. Subsequently, on a whole surface of the first main surface 11Sa of the semiconductor substrate 11, an insulating film (whose illustration is omitted) such as a silicon oxide film is formed so as to cover the lower electrode 5 by using, for example, a plasma CVD method. At this time, the insulating film is deposited so that a space between the adjacent lower electrodes 5 is sufficiently filled by a thickness of the insulating film. Next, by, for example, a CMP method or an etching back method, the insulating film on the surface of the lower electrode 5 is removed to expose the surface of the lower electrode 5, and besides, the insulating film remains between the adjacent lower electrodes 5.

Figure 7B:
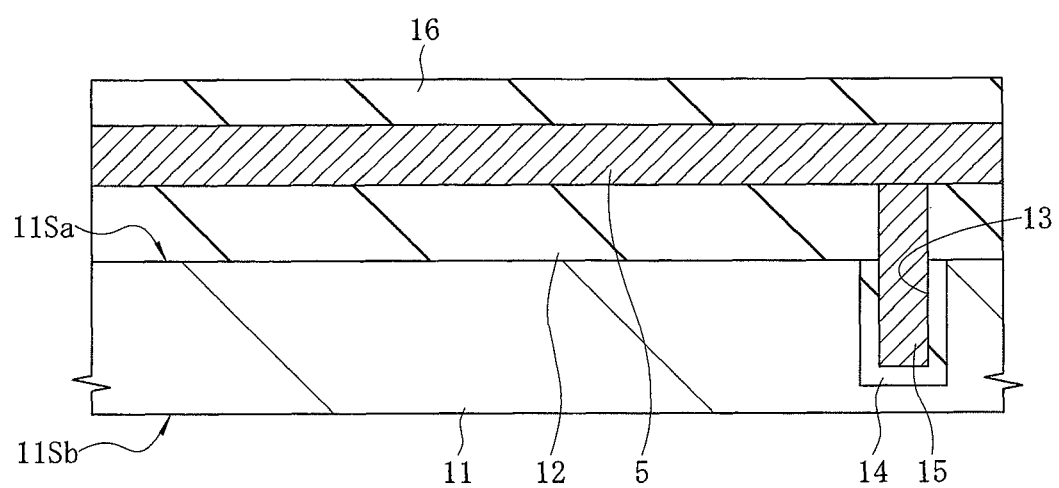

Next, as illustrated in FIG. 7B, on the whole surface of the first main surface 11Sa of the semiconductor substrate 11 (that is on the insulating films on the lower electrode 5 and between the adjacent lower electrodes 5), a second insulating film 16 is formed. As the second insulating film 16, for example, a silicon oxide film, a silicon nitride film, or their stacked film, which are formed by a CVD method, is used. When a metal having a high melting point such as tungsten is used for the lower electrode 5, an LPCVD method capable of forming a denser film than that formed by the plasma CVD method may be used.

Figure 8A:
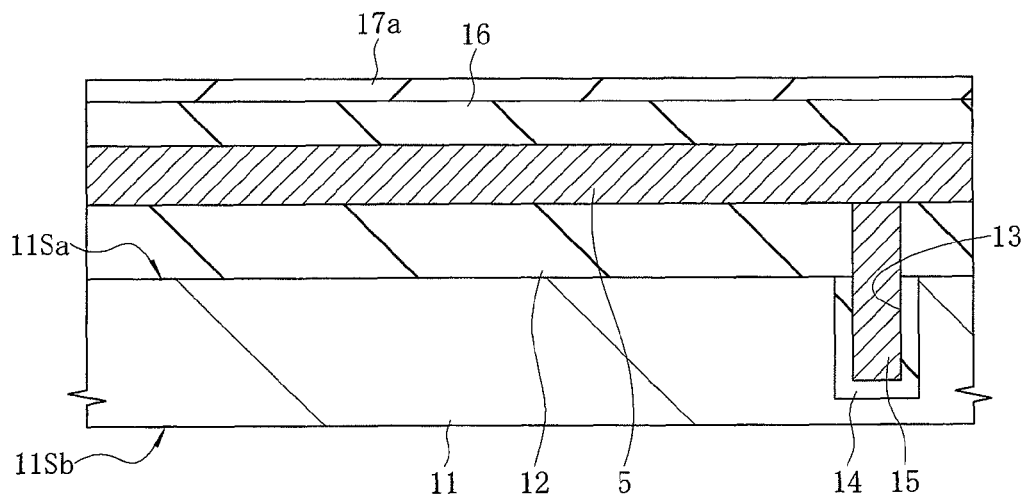
FIGS. 8A and 8B are cross-sectional views of principal parts in a manufacturing step for the capacitive micromachined ultrasonic transducer, continued from FIGS. 7A and 7B.

Next, as illustrated in FIG. 8A, on the whole surface of the first main surface 11Sa of the semiconductor substrate 11 (that is on the second insulating film 16), a sacrificial film 17a made of, for example, an amorphous silicon film is formed by using, for example, a plasma CVD method.

Figure 8B:
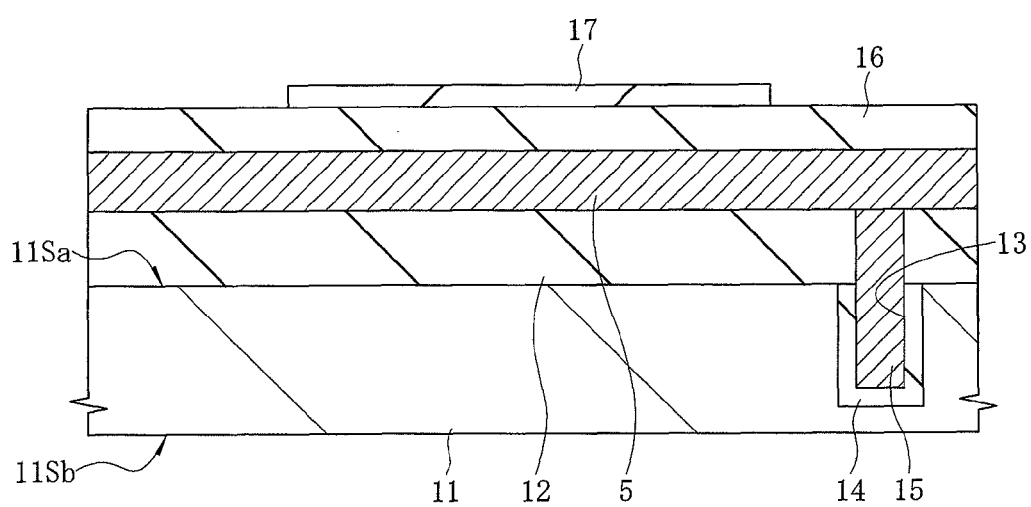

Next, as illustrated in FIG. 8B, by patterning the sacrificial film 17a by using, for example, a lithography method and a dry etching method, a sacrificial-film pattern (sacrificial-film pattern for forming a hollow portion) 17 is formed. The sacrificial-film pattern 17 is formed above the lower electrode 5 through the insulating film 16. The sacrificial-film pattern 17 is a pattern for forming the hollow portion, and a planar shape of the sacrificial-film pattern 17 is formed as same as a planar shape of the hollow portion. Therefore, in a predetermined region where the hollow portion is to be formed, the sacrificial-film pattern 17 is formed.

Figure 9A:
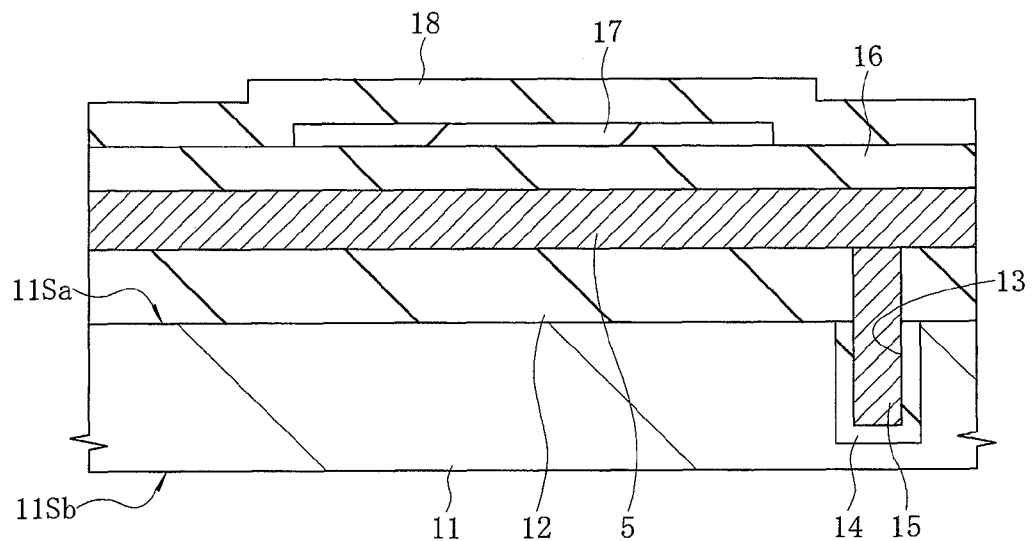
FIGS 9A and 9B are cross-sectional views of principal parts in a manufacturing step for the capacitive micromachined ultrasonic transducer, continued from FIGS. 8A and 8B.

Next, as illustrated in FIG. 9A, on the whole surface of the first main surface 11Sa of the semiconductor substrate 11, a third insulating film 18 is formed so as to cover a surface of the sacrificial-film pattern 17. As the third insulating film 18, similarly to the second insulating film 16, for example, a silicon oxide film, a silicon nitride film, or their stacked film, which are formed by a plasma CVD method, can be used.

Figure 9B:
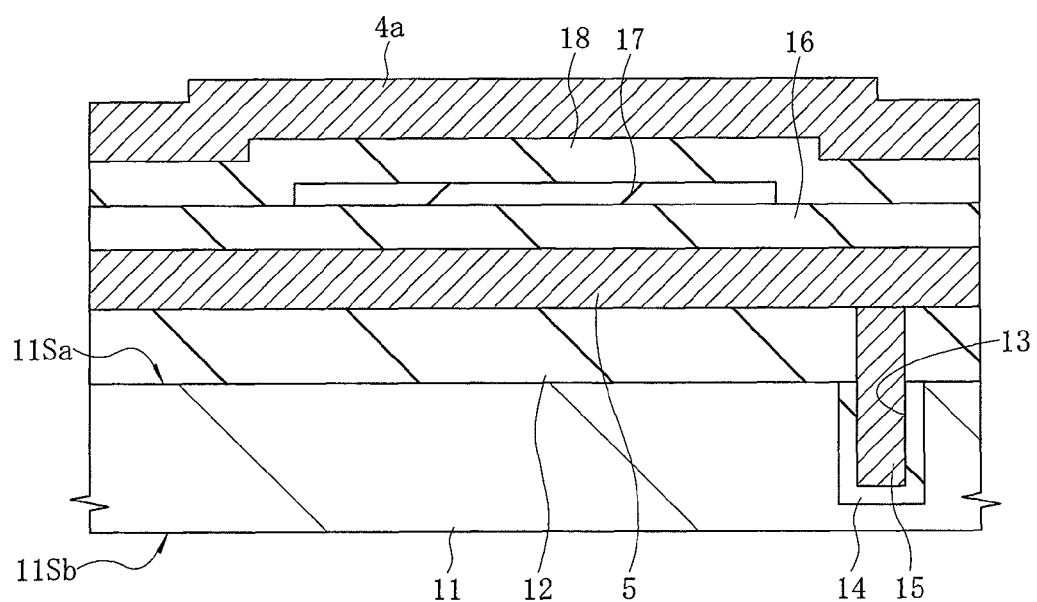

Next, as illustrated in FIG. 9B, on the third insulating film 18, a conductive film 4a for forming an upper electrode is formed. The conductive film 4a is formed on the whole surface of the first main surface 11Sa of the semiconductor substrate 11. The conductive film 4a is made of a metal film or a film having metal conduction, such as a stacked film formed by a titanium nitride film, an aluminum film, and a titanium nitride film in order from bottom up. The aluminum film is made of a conductive film containing aluminum as a main component, such as a pure aluminum film or an aluminum alloy film. The conductive film 4a can be formed by, for example, a sputtering method. Also, the conductive film 4a for forming the upper electrode is thinner than the conductive film 5a for forming the lower electrode such that a thickness of the conductive film 4a is, for example, about 0.4 μm. Further, when the conductive film 4a is the stacked film formed by the titanium nitride film, the aluminum film, and the titanium nitride film, the aluminum film is a main conductive film of the upper electrode 4, and therefore, the aluminum film is thicker than the titanium nitride film such that a thickness of the aluminum film is about 0.3 μm and a thickness of each titanium nitride film above and below the aluminum film is about 0.05 μm. Still further, instead of the titanium nitride film, a stacked film formed by a titanium film and a titanium nitride film, a tungsten film, or others can be also used.

Figure 10A:
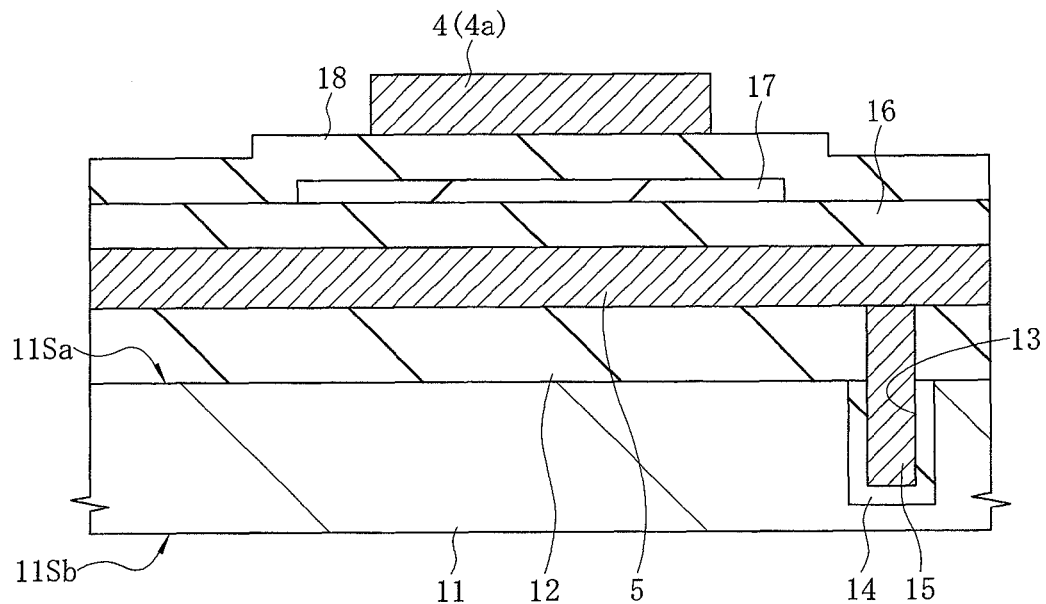
FIGS. 10A and 10B are cross-sectional views of principal parts in a manufacturing step for the capacitive micromachined ultrasonic transducer, continued from FIGS. 9A and 9B.

Next, as illustrated in FIG. 10A, the conductive film 4a is patterned by using, for example, a lithography method and a dry etching method. By the patterned conductive film 4a, the upper electrode 4 is formed.

Figure 10B:
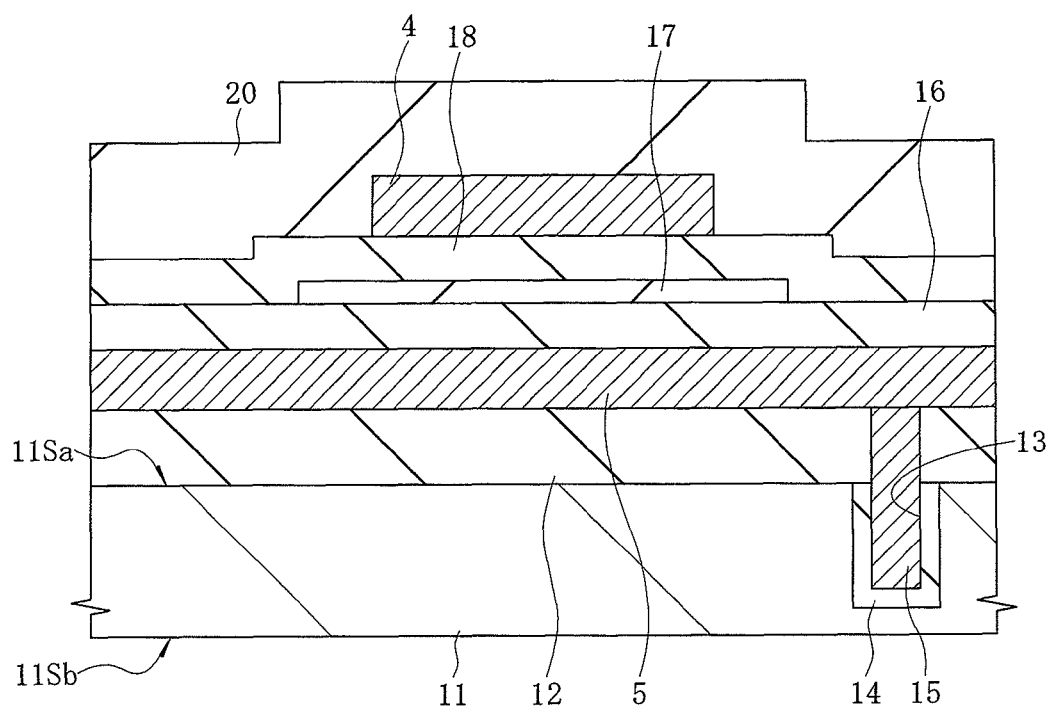

Next, as illustrated in FIG. 10B, on the whole surface of the first main surface 11Sa of the semiconductor substrate 11, a fourth insulating film 20 is formed so as to cover the upper electrode 4. The fourth insulating film 20 is made of, for example, a silicon nitride film or others, and can be formed by using, for example, a plasma CVD method. Also, a thickness of the fourth insulating film 20 can be set to, for example, about 0.5 μm.

Figure 11A:
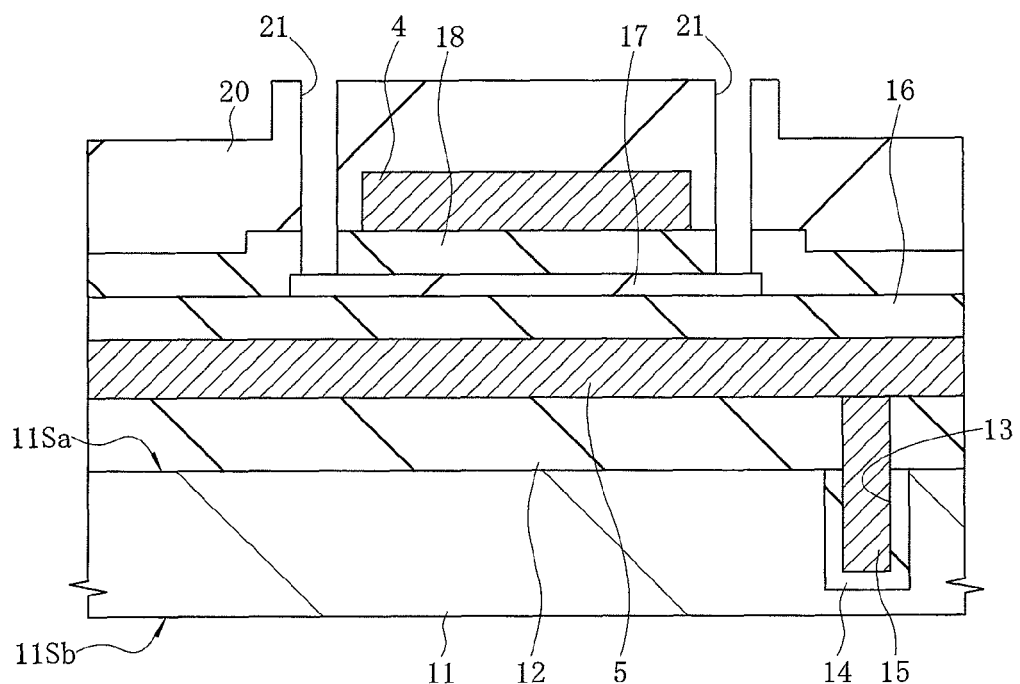
FIGS. 11A and 11B are cross-sectional views of principal parts in a manufacturing step for the capacitive micromachined ultrasonic transducer, continued from FIGS. 10A and 10B.

Next, as illustrated in FIG. 11A, by using a lithography method and a dry etching method, a hole (opening portion) 21 reaching the sacrificial-film pattern 17 to expose apart of the sacrificial-film pattern 17 is formed in the third and fourth insulating films 18 and 20. The hole 21 is formed at a position overlapped with the sacrificial-film pattern 17 in plane, so that the part of the sacrificial-film pattern 17 is exposed on a base portion of the hole 21.

Figure 11B:
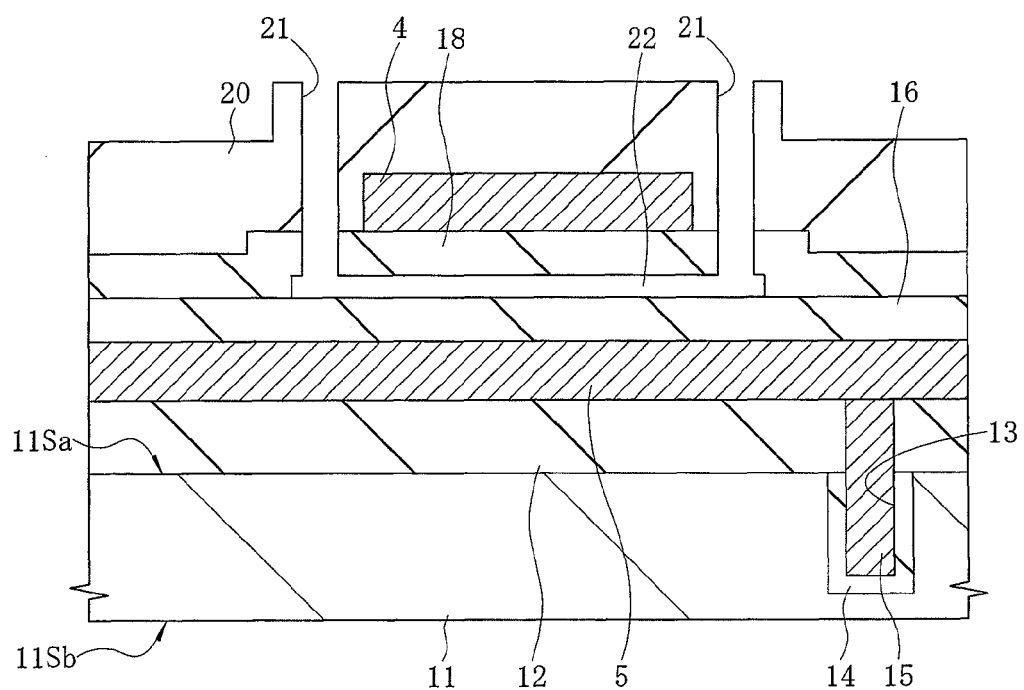

Next, as illustrated in FIG. 11B, the sacrificial-film pattern 17 is selectively etched through the hole 21 by using, for example, a dry etching method with xenon fluoride ($XeF_2$). In this manner, the sacrificial-film pattern 17 is selectively removed, and a region where the sacrificial-film pattern 17 has existed becomes a hollow portion 22, so that the hollow portion 22 is formed between the second insulating film 16 and the third insulating film 18. That is, the hollow portion 22 is formed between surfaces of the lower electrode 5 and the upper electrode 4 facing each other (a region where the sacrificial-film pattern 17 is removed). Instead of the dry etching method with xenon fluoride ($XeF_2$), the sacrificial-film pattern 17 can be selectively removed by a dry etching method with $ClF_3$ or others to form the hollow portion 22.

Figure 12A:
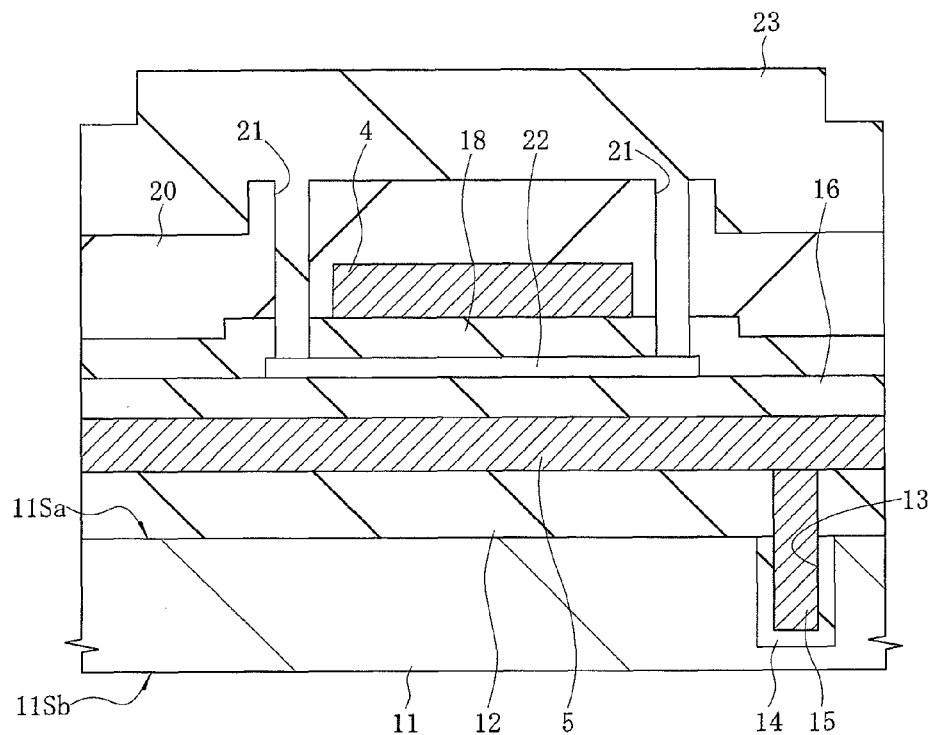
FIGS. 12A and 12B are cross-sectional views of principal parts in a manufacturing step for the capacitive micromachined ultrasonic transducer, continued from FIGS. 11A and 11B.

Next, as illustrated in FIG. 12A, on the whole surface of the first main surface 11Sa of the semiconductor substrate 11 (that is on the fourth insulating film 20), a fifth insulating film 23 is formed. In this manner, a part of the fifth insulating film 23 is buried inside the hole 21, so that the hole 21 can be covered. The fifth insulating film 23 is made of, for example, a silicon nitride film, and can be formed by using a plasma CVD method or others. Also, a thickness of the insulating film 23 can be set to, for example, about 0.8 μm. And then, although not illustrated, on the whole surface of the first main surface 11Sa of the semiconductor substrate 11 (that is on the insulating film 23), a polyimide film is formed, and becomes a protective film by a thermal process.

Figure 12B:
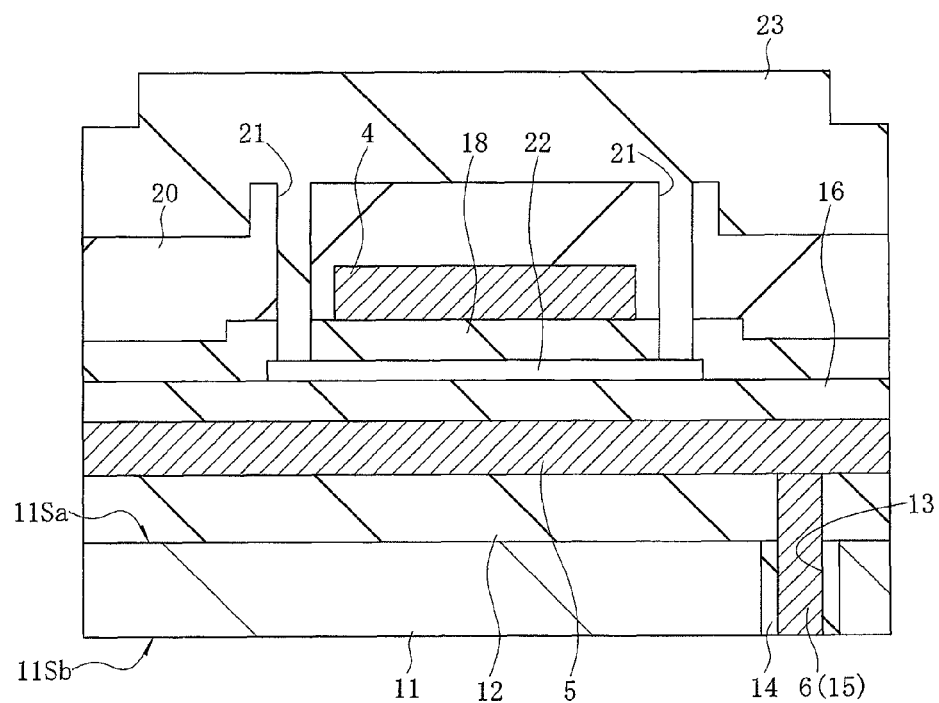

Next, as illustrated in FIG. 12B, the conductive film 15 buried inside the hole 13 is exposed by mechanically polishing the second main surface 11Sb side of the semiconductor substrate 11, so that the through electrode 6 formed by the conductive film 15 (the conductive film 15 filled inside the hole 13 is called the through electrode because the conductive film 15 is arranged to penetrate through the semiconductor substrate 11) is formed. The thickness of the semiconductor substrate 11 is formed by the polishing to be, for example, 50 μm, which is thinner than 70 μm of a depth of the hole 13 illustrated in FIG. 4B described above. In this manner, the cell array (first chip 1) of the capacitive micromachined ultrasonic transducer is formed.

Next, a method of manufacturing the second chip 2 according to the first embodiment is described with reference to cross-sectional views of principal parts of the second chip 2 illustrated in FIGS. 13A to 16.

Figure 13A:
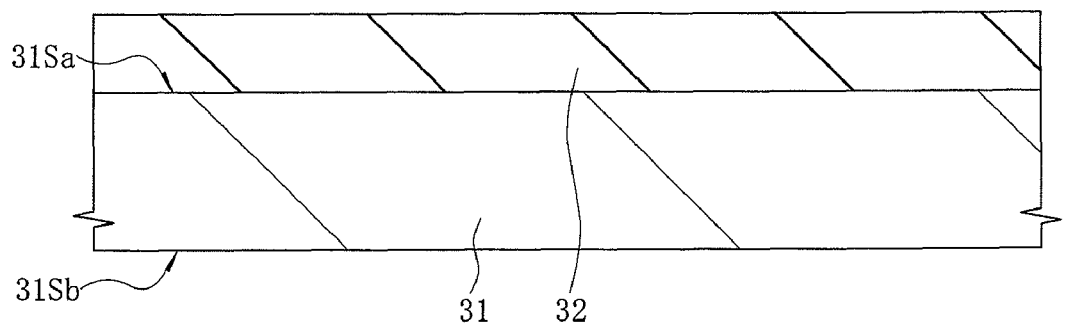
FIGS. 13A and 13B are cross-sectional views of principal parts in a manufacturing step for the capacitive micromachined ultrasonic transducer (second chip) according to the first embodiment of the present invention.

First, as illustrated in FIG. 13A, a semiconductor substrate 31 (a semiconductor thin plate having a planar, substantially round shape called semiconductor wafer at this stage) is prepared. The semiconductor substrate 31 is made of, for example, silicon single crystal, and has a first main surface (upper surface/front surface) 31Sa and a second main surface (lower surface/rear surface) 31Sb positioned opposite to each other along a thickness direction. Subsequently, on a whole surface of the first main surface 31Sa of the semiconductor substrate 31, a sixth insulating film 32 made of, for example, silicon oxide film is formed. A thickness of the sixth insulating film 32 can be set to, for example, 0.8 μm.

Figure 13B:
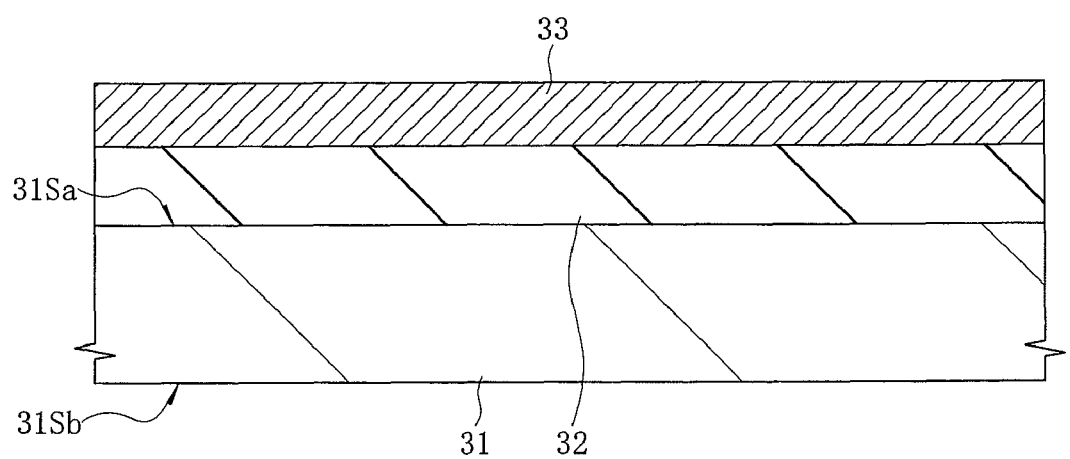

Next, as illustrated in FIG. 13B, on the sixth insulating film 32, a conductive film 33 for forming a wiring of connecting between the lower electrodes 5 of the adjacent first chips 1 is formed. The conductive film 33 is made of a metal film or a film having metallic conduction, such as a stacked film formed by a titanium nitride film, an aluminum film, and a titanium nitride film in order from bottom up. The aluminum film is made of a conductive film containing aluminum as a main component, such as a pure aluminum film or an aluminum alloy film. The conductive film 33 can be formed by using, for example, a sputtering method. Also, when the conductive film 33 is the stacked film formed by the titanium nitride film, the aluminum film, and the titanium nitride film, the aluminum film is thicker than the titanium nitride film such that a thickness of the aluminum film is about 0.6 μm and a thickness of each titanium nitride film above and below the aluminum film is about 50 nm.

Figure 14A:
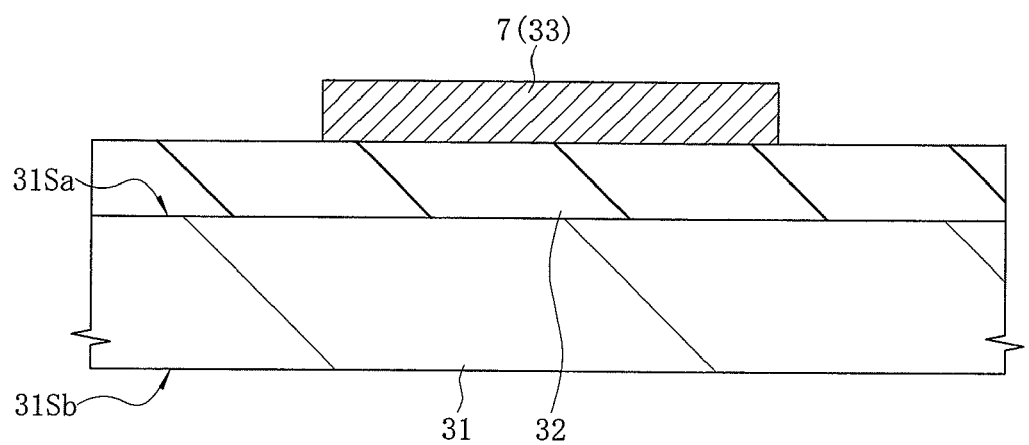
FIGS. 14A and 14B are cross-sectional views of principal parts in a manufacturing step for the capacitive micromachined ultrasonic transducer, continued from FIGS. 13A and 13B.

Next, as illustrated in FIG. 14A, the conductive film 33 is patterned by using, for example, a lithography method and a dry etching method. By the patterned conductive film 33, a wiring layer 7 is formed.

Figure 14B:
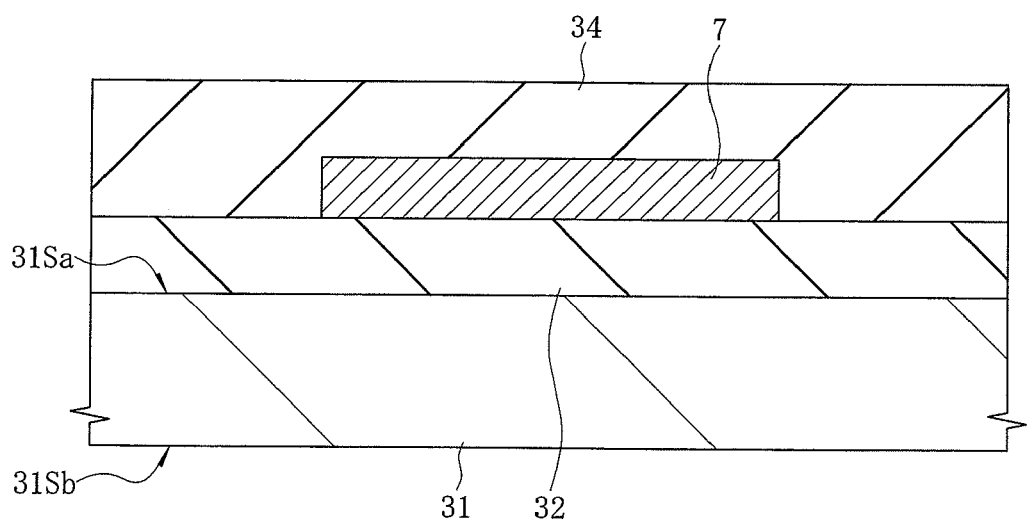

Next, as illustrated in FIG. 14B, on a whole surface of the first main surface 31Sa of the semiconductor substrate 31, a seventh insulating film 34 such as a silicon oxide film is formed so as to cover the wiring layer 7 by using, for example, a plasma CVD method. At this time, a thickness of the seventh insulating film 34 is set so that a space between the adjacent wiring layers 7 is sufficiently filled by the seventh insulating film 34.

Figure 15A:
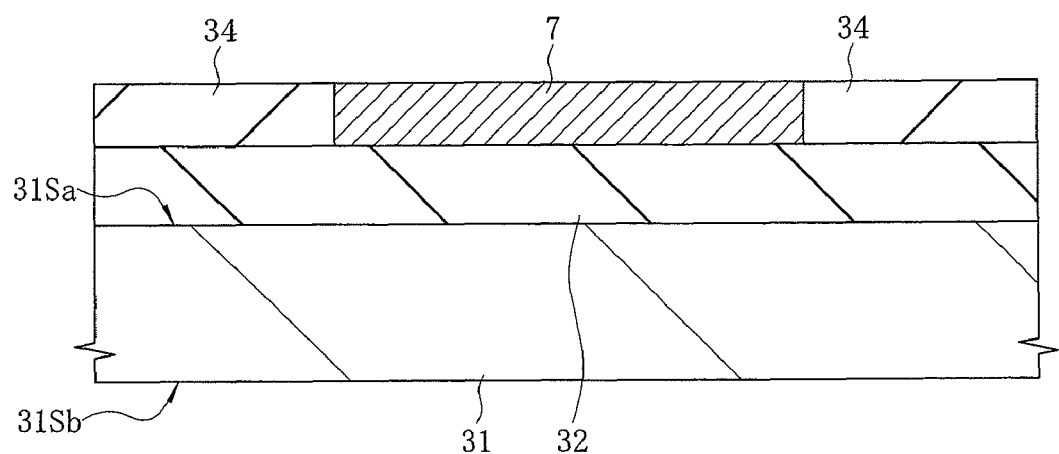
FIGS. 15A and 15B are cross-sectional views of principal parts in a manufacturing step for the capacitive micromachined ultrasonic transducer, continued from FIGS. 14A and 14B.
Figure 15B:
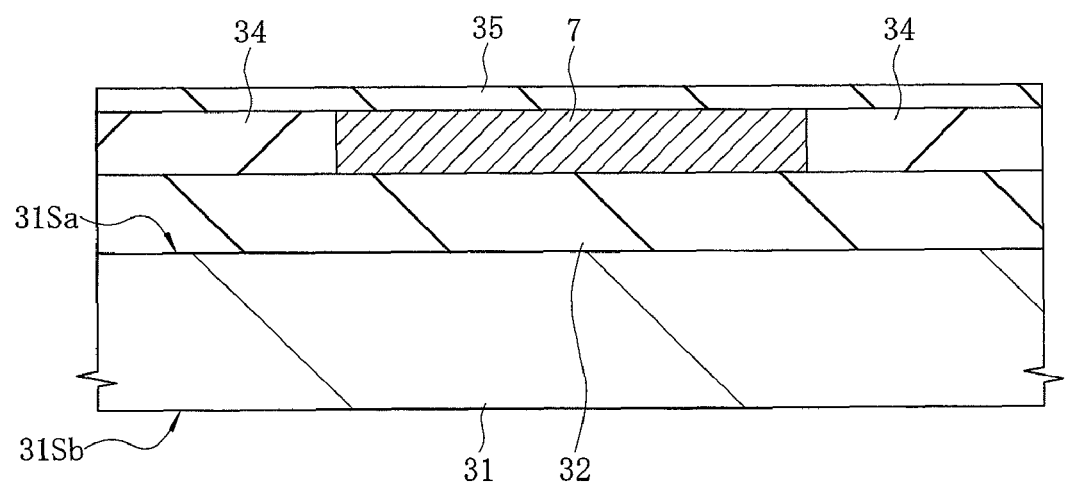

Next, as illustrated in FIG. 15A, a surface of the seventh insulating film 34 is polished by using a CMP method to expose the surface of the wiring layer 7 and flatten the surface. Subsequently, as illustrated in FIG. 15B, on a whole surface of the second main surface 31Sa of the semiconductor substrate 31, an eighth insulating film 35 such as a silicon oxide film is formed so as to cover the wiring layer 7 and the seventh insulating film 34 by using, for example, a plasma CVD method.

Figure 16:
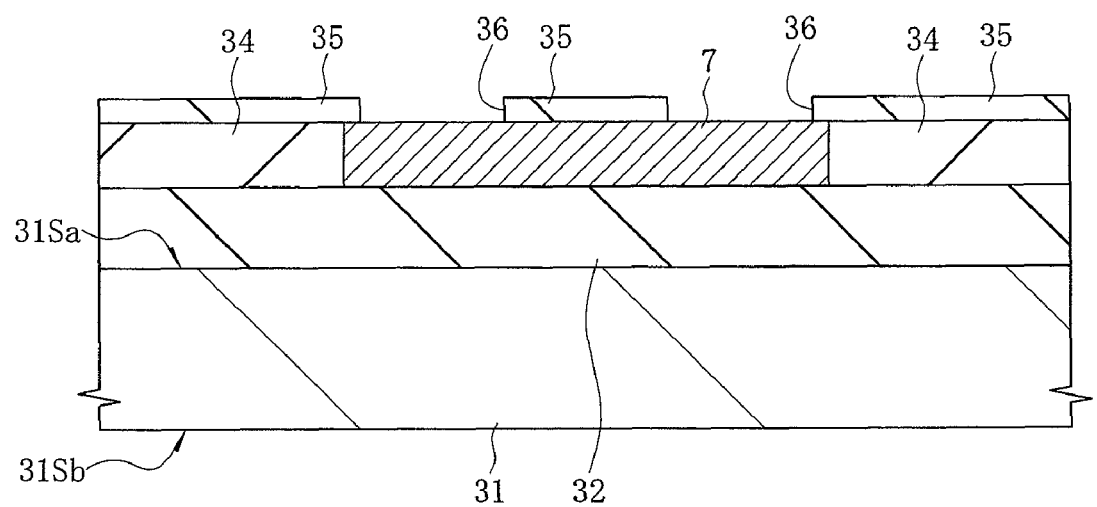
FIG. 16 is a cross-sectional view of a principal part in a manufacturing step for the capacitive micromachined ultrasonic transducer, continued from FIGS. 15A and 15B.

And then, as illustrated in FIG. 16, the eighth insulating film 35 is patterned by using, for example, a lithography method and a dry etching method to form an opening portion 36.

The opening portion 36 is used for arranging a bump for connecting between the through electrodes 6 of the first chip 1 and the wiring layer 7 or used as wire-bonding pads (for example, the above-described pads P1 and P2 in FIG. 1C) for connecting between the wiring layer 7 and an external wire of the second chip 2. By the above-described manufacturing steps, the second chip 2 of the capacitive micromachined ultrasonic transducer is formed.

Figure 17:
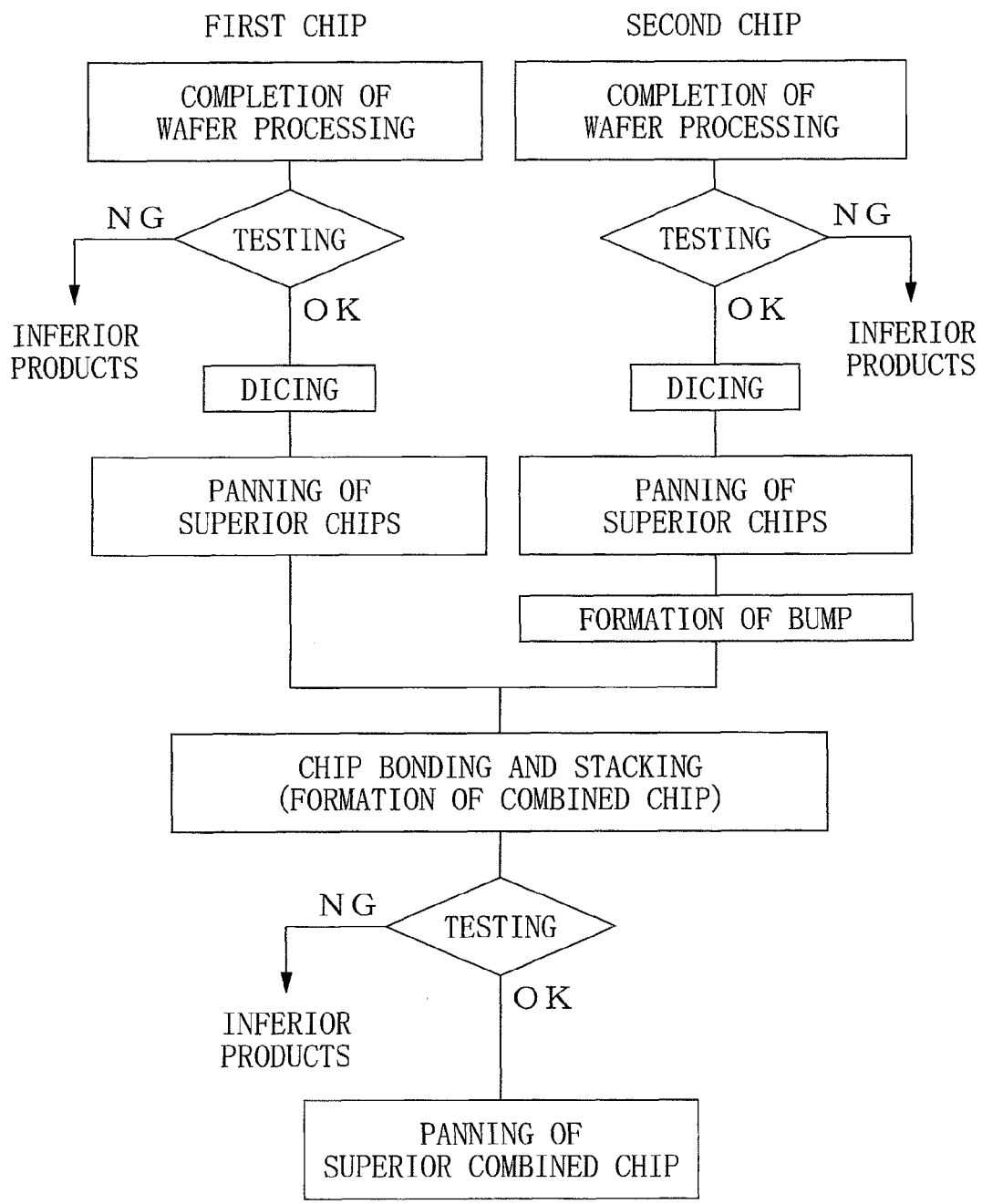
FIG. 17 is an explanatory diagram of a step flow for the capacitive micromachined ultrasonic transducer (combined chip) according to the first embodiment of the present invention.
Figure 18:
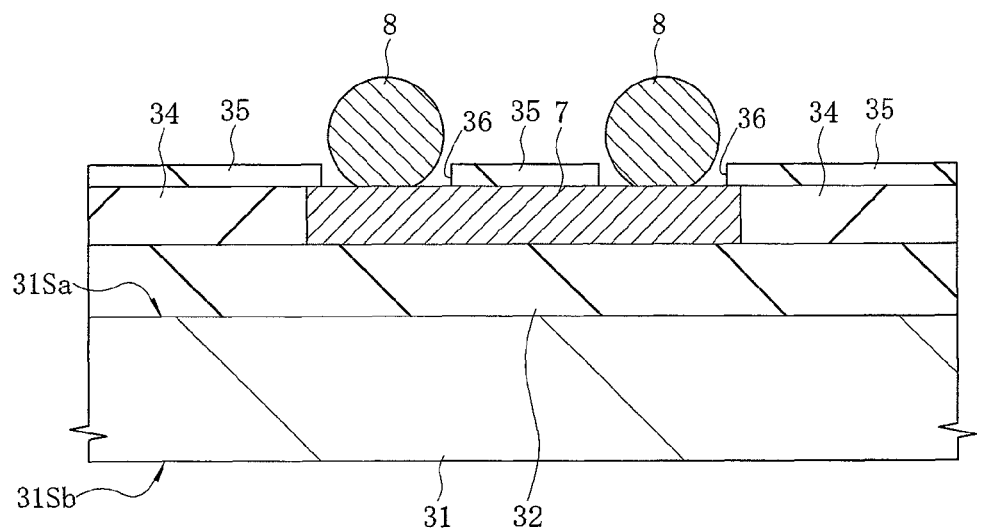
FIG. 18 is a cross-sectional view of a principal part in a manufacturing step for the capacitive micromachined ultrasonic transducer (combined chip) according to the first embodiment of the present invention.
Figure 19:
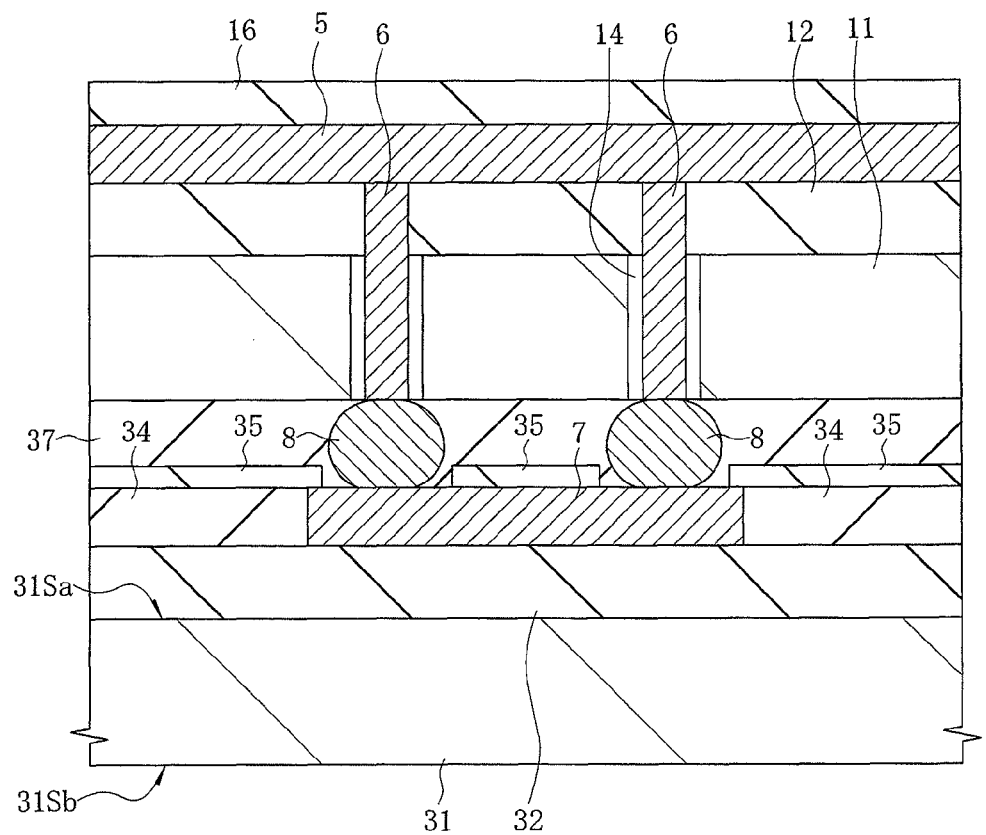
FIG. 19 is a cross-sectional view of a principal part in a manufacturing step for the capacitive micromachined ultrasonic transducer, continued from FIG. 18.

Next, a method of forming a combined chip 3 by stacking the first chip 1 and the second chip 2 according to the first embodiment is described with reference to FIGS. 17 to 19. FIG. 17 is a step flow chart, and FIGS. 18 and 19 are cross-sectional views of principal parts of the second chip 2 and the combined chip 3, respectively.

First, in the semiconductor substrate (semiconductor wafer) 11 including the first chip 1, properties of the completed cell array are tested for each upper electrode 4 and each lower electrode 5. Contents of the test are capacitance-voltage characteristics between the upper electrode 4 and the lower electrode 5, breakdown voltage between the upper electrode 4 and the lower electrode 5, short-circuit check between the adjacent upper electrodes 4, short-circuit check between the adjacent lower electrodes 5, and others. As a result of the test, a first chip 1 whose error is not verified is categorized as a superior product, a first chip 1 whose error is verified is categorized as an inferior product, and the superior/inferior product is cleared by, for example, putting a mark on the inferior first chip 1, recording the same, or others.

And then, at the above-described region J dividing the lower electrodes 5 as illustrated in FIG. 3, the semiconductor substrate (semiconductor wafer) 11 is diced and divided into a plurality of first chips 1. Here, in the dicing, a space for cutting is definitely required. If the space for cutting is large and a pitch of the upper electrode 4 at this part is changed, there is a possibility that sound wave which is not predetermined transmitting sound and called grating lobe is radiated to form an artifact. Therefore, the space for cutting is set to be, for example, sufficiently smaller than a pitch of the block B ("d" shown in FIG. 1B described above (for example, ½ of a wavelength λ of the transmitting wave)), such as equal to or lower than 10% of the pitch. In this manner, in the diagnosis apparatus, good images can be obtained. As a method of reducing the space for cutting as small as possible, a method called stealth dicing by which only an inside of the semiconductor substrate 11 is melted with using laser beam for dicing in a micro region is effective. And then, only the superior first chip 1 is selected and panned.

On the other hand, a test of disconnection or short circuit is similarly performed for the second chip 2 in which the wiring layer 7 is formed, and the superior/inferior chip is discriminated and recorded. And then, the semiconductor substrate (semiconductor wafer) 31 is diced, and only the superior second chip 2 is selected and panned.

Next, as illustrated in FIG. 18, in the opening portion 36 of the second chip 2 which is determined as the superior product and panned, a bump 8 is formed. The bump 8 is formed by a stud bump method with using a gold wire, a solder reflow method, or others.

Next, as illustrated in FIG. 19, the plurality of first chips 1 and the single second chip 2 are arranged in a die so that the through electrode 6 of the first chip 1 is contacted with the bump 8 of the second chip 2, and are adhered to each other with applying pressure.

In this manner, as illustrated in FIGS. 1A and 2 described above, the combined chip 3 is substantially completed such that the combined chip 3 has: the plurality of first chips 1 arranged adjacent to each other in plane in the upper layer of the combined chip 3; and the second chip 2 in the lower layer thereof, in which the wiring layer 7 for connecting between the lower electrodes 5 between the adjacent first chips 1 is formed.

In the capacitive micromachined ultrasonic transducer formed by the combined chip 3 according to the first embodiment, its manufacturing yield is increased compared to the capacitive micromachined ultrasonic transducer formed by one conventional semiconductor chip. This is because only the first chips 1 having the relatively small areas which are determined as the superior products are selected and are connected with each other. Note that, although the second chip 2 has the relatively large area as same as that of the capacitive micromachined ultrasonic transducer formed by one conventional semiconductor chip, contribution of the area to the yield is negligibly small because the second chip is formed with only one wiring layer 7.

Incidentally, in the description for the step flow of forming the above-described combined chip 3, the first chip 1 is divided by the dicing when the first chip 1 is obtained from the semiconductor wafer (semiconductor substrate 11). However, all first chips 1 may be not always individually divided by the dicing.

Figure 20:
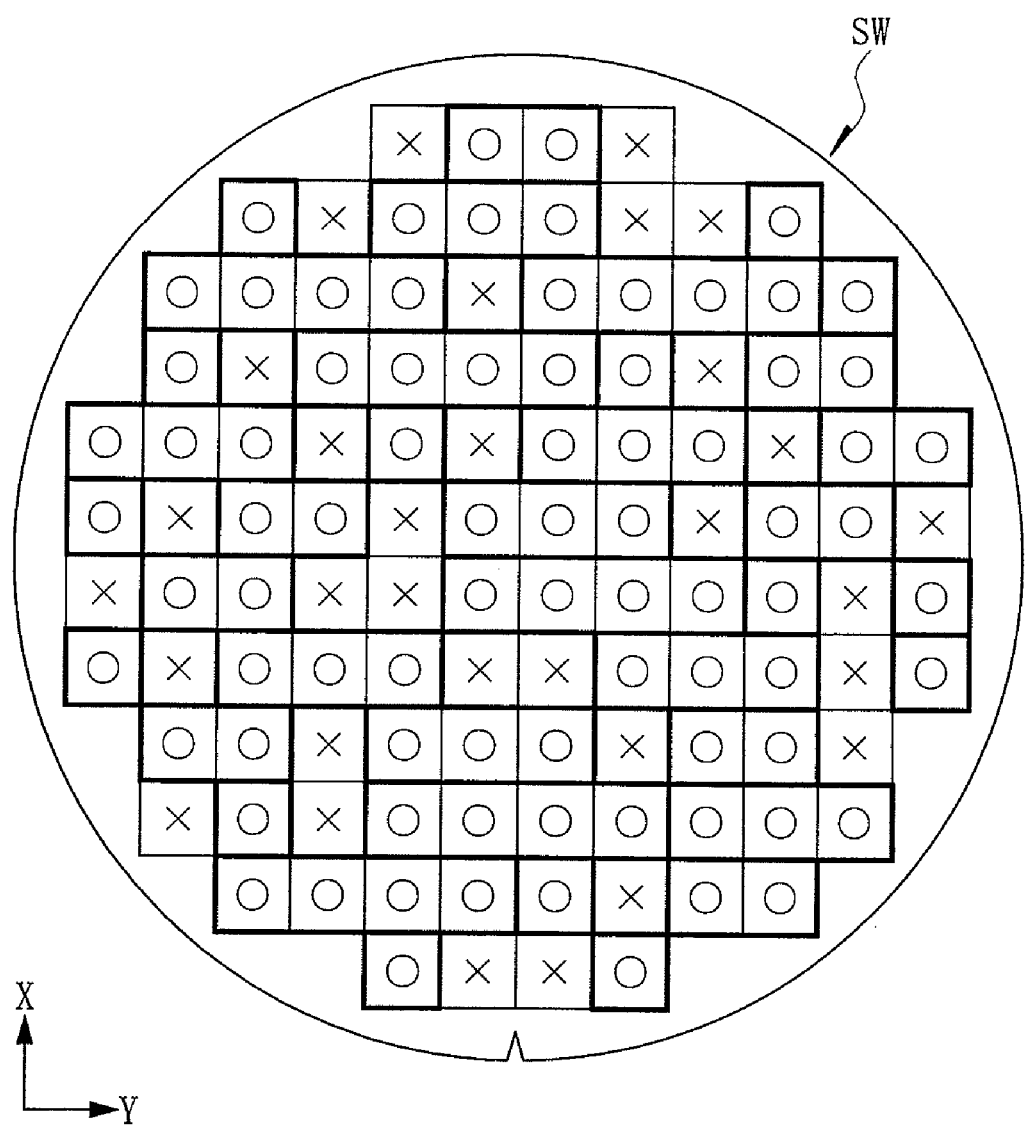
FIG. 20 is a wafer-mapping diagram illustrating a judge result of a superior/inferior product for the first chip according to the first embodiment of the present invention.

FIG. 20 is an example of a map illustrating the determination result of the superior/inferior product when the plurality of first chips formed on a semiconductor wafer SW are tested. In this figure, a circle mark represents the superior first chip 1, and a cross mark represents the inferior first chip 1. Here, a case that the combined chip 3 is formed of four first chips 1 is exemplified. As illustrated in FIG. 20, one piece of the first chip 1 determined as the superior product by the test, two thereof, three thereof, four thereof, or more are continuously provided in the Y direction.

Figure 21A:
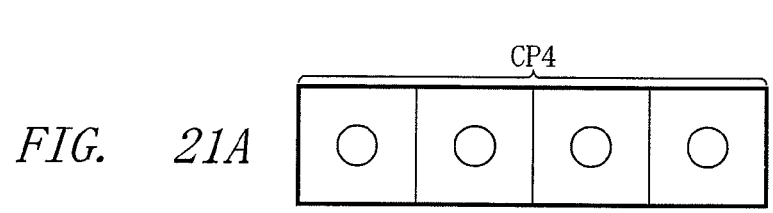
FIGS. 21A to 21H are explanatory diagrams for a combination method of the first chip according to the first embodiment of the present invention.
Figure 21B:
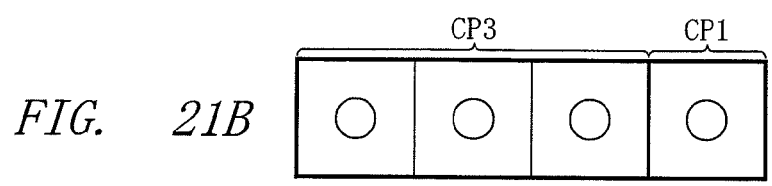
Figure 21C:
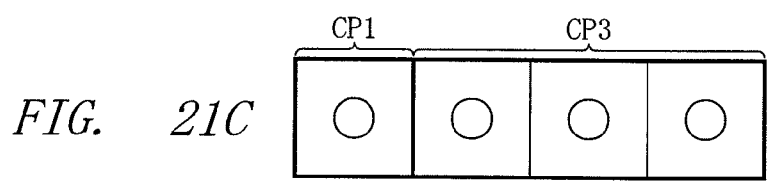
Figure 21D:
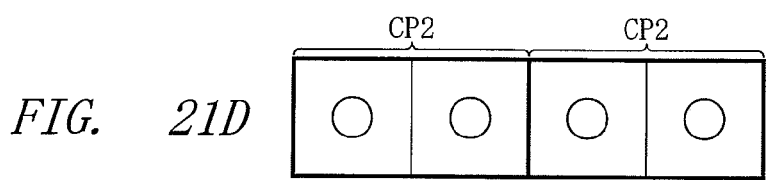
Figure 21E:
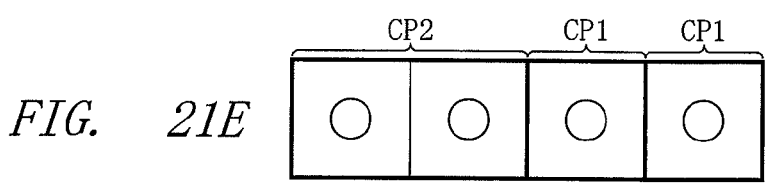
Figure 21F:
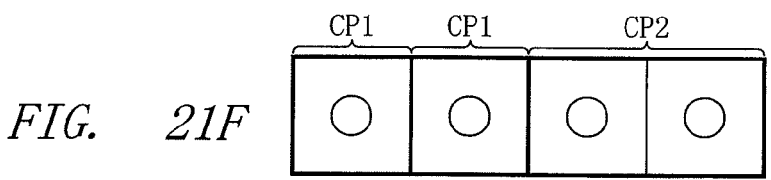
Figure 21G:
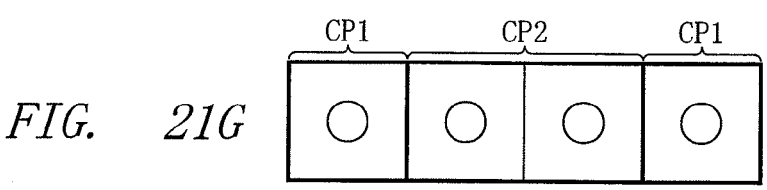
Figure 21H:
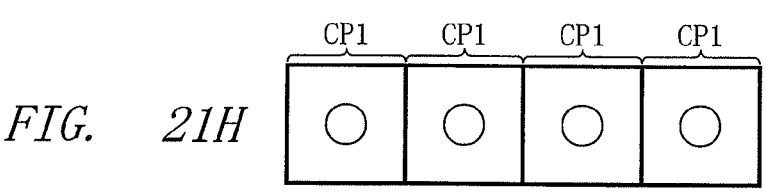

As illustrated in FIG. 21A, when four superior first chips 1 are continuously obtained, the four-continuous superior first chips 1 (CP4) are divided as one unit, and can be used for forming the combined chip 3. Also, as illustrated in FIG. 21B or 21C, when three superior first chips 1 are continuously obtained, the three-continuous superior first chips (CP3) are divided as one unit, and one of the three-continuous superior first chips (CP3) and one of the superior first chip 1 (CP1) may be combined for forming the combined chip 3. Further, as illustrated in FIGS. 21D to 21G, when two superior first chips 1 are continuously obtained, the two-continuous superior first chips (CP2) are divided as one unit, and two of the two-continuous superior first chips (CP2) may be combined, or one of the two-continuous superior first chips 1 (CP2) and two of the superior first chips (CP1) maybe combined for forming the combined chip 3. Note that, as illustrated in FIG. 21H, regardless of with or without the continuous superior first chips 1, four of the superior first chips (CP1) maybe combined for forming the combined chip 3.

Next, a case that the semiconductor device (capacitive micromachined ultrasonic transducer) according to the first embodiment is applied to, for example, an ultrasonic diagnostic apparatus is described.

Figure 22:
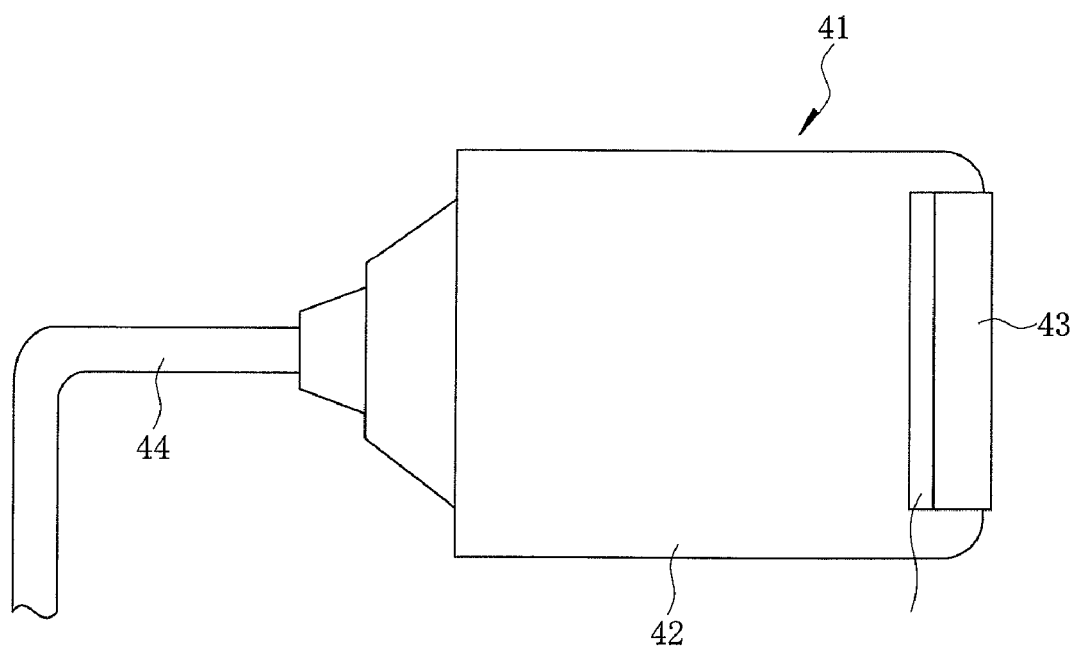
FIG. 22 is an outline view of a probe of an ultrasonic diagnostic apparatus to which the capacitive micromachined ultrasonic transducer according to the first embodiment of the present invention is applied.

The ultrasonic diagnostic apparatus is a medical diagnostic apparatus with using permeability of sound wave, capable of imaging and visualizing an inside of a biological body in real time, which cannot be seen from outside, with using ultrasonic wave over an audible sound range. An outline view of a probe of the ultrasonic diagnostic apparatus is illustrated in FIG. 22.

A probe 41 is a unit of transmitting/receiving ultrasonic waves. As illustrated in FIG. 22, the above-described combined chip 3 is attached to a tip surface of a probe case 42 forming the probe 41 so that the first main surface 11Sa of the first chip 1 is faced outside. Further, on the first main surface 11Sa side of the combined chip 3, an audio lens 43 is attached. The combined chip 3 is connected to a main system of the diagnostic apparatus via a cable 44.

In the ultrasonic diagnosis, a tip portion (on the audio lens 43 side) of the probe 41 is contacted with a body surface (surface of a biological body), and then, this is scanned as gradually and finely shifting its position. At this time, ultrasonic pulses of several MHz are transmitted from the probe 41 contacted with the body surface into the biological body, and its reflected wave having different acoustic impedance from a tissue boundary is received. In this manner, a tomographic image of the biological body tissue can be obtained, so that information relating to an object can be obtained. Depending on time interval from transmitting the ultrasonic wave until receiving the wave, distance information down to the reflecting object can be obtained. Also, from a level of the received wave or an outer shape thereof, information relating to existence of the reflecting object or characteristics thereof can be obtained.

By using the combined chip 3 according to the first embodiment for the probe 41 of such an ultrasonic diagnostic apparatus, manufacturing yield of the probe 41 can be increased.

As described above, according to the first embodiment, one capacitive micromachined ultrasonic transducer is formed by arranging the plurality of first chips 1 having the relatively small areas, which are formed of the cell array determined as the superior product by the test, on the surface of the second chip 2 in plane in which the wiring layer 7 is formed so that the plurality of first chips 1 are electrically connected, and therefore, the manufacturing yield of the capacitive micromachined ultrasonic transducer can be increased.

Second Embodiment

A semiconductor device (capacitive micromachined ultrasonic transducer manufactured by using a MEMS technique) according to a second embodiment is formed of the combined chip formed by stacking the first chip in which the cell array is arranged and the second chip in which the wiring layer is formed, similarly to that according to the first embodiment described above. However, the dividing location in the first chip is different from that of the above-described first embodiment.

The capacitive micromachined ultrasonic transducer according to the second embodiment is described with reference to FIGS. 23A to 25B. FIGS. 23A, 23B, and 23C are plan views each illustrating a whole ultrasonic transducer, FIG. 24 is a cross-sectional view of a principal part taken along line B-B' in FIG. 23A, and FIGS. 25A and 25B are plan views of principal parts illustrating an enlarged part (connecting portion) of the capacitive micromachined ultrasonic transducer.

In the above-described first embodiment, the dividing location/connecting location J of the first chip 1 is the space portion where the blocks B (the upper electrode 4 formed of four cell columns) are adjacent to each other. On the other hand, in the second embodiment, the dividing location/connecting location J is positioned at the center of the block B (the upper electrode 4 formed of four cell columns). Each two cell columns are taken at the connecting location J as the upper electrode 4, the through electrode 6 is arranged at each taking portion 50, and the through electrode 6 is connected with the wiring layer 7 of the second chip 2 via the bump 8, so that the same bias is simultaneously applied to all CMUT cells C in the upper electrode 4 of the block B extending in the X direction. Other structures and forming processes except for this are the same as those of the above-described first embodiment.

As described above, also according to the second embodiment, the manufacturing yield is increased compared to the capacitive micromachined ultrasonic transducer formed by one conventional semiconductor chip having the relatively large area, and the same effect as that of the above-described first embodiment can be obtained. Further, in the above-described first embodiment, since the dividing location J is positioned between the blocks B, each potential of the blocks B sandwiching the diving location J therebetween is varied, and therefore, there is a possibility that, for example, joint quality between images in the ultrasonic diagnostic apparatus is worsen. However, in the second embodiment, such a problem can be avoided.

Third Embodiment

A semiconductor device (capacitive micromachined ultrasonic transducer manufactured by using a MEMS technique) according to a third embodiment is formed of the combined chip formed by stacking the first chip in which the cell array is arranged and the second chip in which the wiring layer is formed, similarly to that according to the first embodiment described above. However, a point that a compensation region having the same width as the space for cutting is arranged along the X direction between the adjacent blocks in the first chips 1 is different from that of the above-described first embodiment.

A first example of the capacitive micromachined ultrasonic transducer according to the third embodiment is described with reference to plan views of principal parts illustrating an enlarged part (connecting portion) of the capacitive micromachined ultrasonic transducer illustrated in FIGS. 26A and 26B.

While the space for cutting is always required in cutting the first chip 1, it is required to form the space for cutting sufficiently smaller than the pitch d of the block B in the Y direction. However, particularly in the capacitive micromachined ultrasonic transducer for high frequency, it is required to form a cell size smaller than that of the capacitive micromachined ultrasonic transducer for low frequency in order to transmit sound wave having high frequency. In this manner, the area of the semiconductor chip tends to be decreased, and the manufacturing yield tends to be increased. However, there is a possibility that the space for cutting is not negligible for the pitch d of the block B in the Y direction. As increasing the space for cutting and changing the pitch d in the space for cutting of the block B along the Y direction, the grating lobe occurs to form the artifact.

In the first example of the third embodiment, as illustrated in FIG. 26A, a compensation region R having the same width as the space for cutting is arranged along the X direction between the blocks B arranged along the Y direction. In this manner, the occurrence of the grating lobe can be suppressed, so that the formation of the artifact can be prevented. Note that other structures and forming processes except for this are the same as those of the above-described first embodiment.

A second example of the capacitive micromachined ultrasonic transducer according to the third embodiment is described with reference to plan views of principal parts illustrating an enlarged part (connecting portion) of the capacitive micromachined ultrasonic transducer illustrated in FIGS. 27A and 27B.

In the second example of the third embodiment, as illustrated in FIG. 27A, the first chip 1 is diced in not the zigzag shape but a linear shape. In this case, a conventional blade can be used for the dicing.

Note that it is assumed that the number of cells in the same chip area is reduced depending on the arrangement of the compensation region R compared with the case without arranging the compensation region R, and the transmitting sound pressure is decreased. When the transmitting sound pressure is insufficient, an amplifier is arranged inside the ultrasonic probe, a connector unit, or the diagnostic apparatus system for amplifying the received wave, so that an action for increasing receiver sensitivity or others can be taken.

As described above, also according to the third embodiment, the manufacturing yield is increased compared to the capacitive micromachined ultrasonic transducer formed by one conventional semiconductor chip having the relatively large area, and the same effect as that of the above-described first embodiment can be obtained. Further, the occurrence of the grating lobe can be suppressed, and the formation of the artifact can be prevented, and therefore, for example, good images can be obtained in the ultrasonic diagnostic apparatus.

Fourth Embodiment

A semiconductor device (capacitive micromachined ultrasonic transducer manufactured by using a MEMS technique) according to a fourth embodiment is formed of the combined chip formed by stacking the first chip in which the cell array is arranged and the second chip in which the wiring layer is formed, similarly to that according to the first embodiment described above. However, the number of the blocks B arranged along the Y direction in the first chips 1 is different from that of the above-described first embodiment.

The capacitive micromachined ultrasonic transducer according to the fourth embodiment is described with reference to plan views of principal parts illustrating an enlarged part (connecting portion) of the capacitive micromachined ultrasonic transducer illustrated in FIGS. 28A and 28B.

In the above-described first embodiment, for one first chip 1, the plurality of blocks B are arranged along the Y direction. However, in the fourth embodiment, one block B is arranged along the Y direction for the first chip 1. In this case, since the lower electrode 5 is divided in each block, the lower electrodes 5 between the blocks are connected to each other by forming the through electrode 6 in each block. Also, the bump 8 is formed in each block so as to electrically connect between the through electrode 6 and the wiring layer 7 of the second chip 2. Other structures and forming processes except for this are the same as those of the above-described first embodiment.

As described above, also according to the fourth embodiment, the manufacturing yield is increased compared to the capacitive micromachined ultrasonic transducer formed by one conventional semiconductor chip having the relatively large area, and the same effect as that of the above-described first embodiment can be obtained.

Note that, as each member forming the CMUT cell described in the above-described first to fourth embodiments, one of their combinations is described. Also, while the shape of the CMUT cell described in the above-described first to fourth embodiments is the hexagonal shape, the shape is not limited to this, and may be, for example, a circular shape or a square shape.

Further, as the method of dividing or connecting the first chip (cell array) 1, instead of the method of cutting the cell array in a direction along the upper electrode 4 and connecting to the lower electrode 5 via the second chip 2 as described in the above-described first to fourth embodiments, a method of cutting the cell array in a direction along the lower electrode 5 and connecting to the upper electrode 4 via the second chip 2 may be used. Still further, the combination of these methods may be used.

Still further, in the first to third embodiments, the case that the combined chip 3 is applied to the probe of the medical ultrasonic diagnostic apparatuses is exemplified. Therefore, the CMUT cell has both functions of transmitting and receiving ultrasonic wave. However, the present invention is not limited to this, and the CMUT cell may have only one function of either transmitting or receiving ultrasonic wave.

In the foregoing, the invention made by the inventors of the present invention has been concretely described based on the embodiments. However, it is needless to say that the present invention is not limited to the foregoing embodiments and various modifications and alterations can be made within the scope of the present invention.

INDUSTRIAL APPLICABILITY

A semiconductor device according to the present invention can be used for various-type medical diagnostic apparatuses with using an ultrasonic probe, a defect test apparatus for an inside of machinery, various-type imaging apparatus systems with using ultrasonic wave (for detecting obstacles or others), a positional detection system, a temperature-distribution measuring system, and others.

The invention claimed is:

1. A method of manufacturing a semiconductor device comprising the steps of:
    (a) preparing a first semiconductor substrate;
    (b) forming a plurality of first chips by
        arranging a predetermined number of ultrasonic transducer cell blocks on a front surface of the first semiconductor substrate in a first direction and in a second direction orthogonally crossing the first direction;
        arranging in each said block a predetermined number of said ultrasonic transducer cells, each having an upper electrode and a lower electrode, in the first direction and in the second direction in said block;
        electrically connecting the upper electrodes of said predetermined number of ultrasonic transducer cells arranged in the first direction in said block;
        electrically connecting the lower electrodes of said predetermined number of ultrasonic transducer cells arranged in the second direction in said block; and
        for each of the blocks, exposing a through electrode that is electrically connected with the lower electrode and that is on a rear surface of the first semiconductor substrate;
    (c) testing said plurality of first chips to determine which of the first chips are non-defective first chips;
    (d) singulating the first semiconductor substrate; into the plurality of first chips by dicing the first semiconductor substrate;
    (e) preparing a second semiconductor substrate;
    (f) forming a plurality of second chips, in which a wiring layer is formed, on a front surface of the second semiconductor substrate, wherein each of the first chips has a first area that is smaller than second area of each of the second chips;
    (g) testing said plurality of second chips to determine which of the chips are non-defective second chips;
    (h) singulating the second semiconductor substrate into the plurality of second chips by dicing the second semiconductor substrate; and
    (i) stacking said non-defective first chips on the front surface of one of said non-defective second chips to electrically connect the through electrode exposed on each of the rear surfaces of the non-defective first chips with the wiring layer formed on the front surface of said one non-defective second chip.

2. The method of manufacturing the semiconductor device according to claim 1,
    wherein, in the step of (i), the plurality of first chips are arranged adjacently in a plane.

3. The method of manufacturing the semiconductor device according to claim 1,
    wherein, in the step of (i), the lower electrodes of the plurality of first chips arranged in the second direction are electrically connected with each other in the second direction.

4. The method of manufacturing the semiconductor device according to claim 1, wherein each said cell includes:
    said first semiconductor substrate;
    the lower electrode formed on a first insulating film that is formed on said first semiconductor substrate;
    a second insulating film formed so as to cover the lower electrode;
    a hollow portion formed on the second insulating film so as to overlap with the lower electrode in plan view;
    a third insulating film formed so as to cover the hollow portion, wherein the upper electrode is formed on the third insulating film so as to overlap with the hollow portion in plan view.

5. The method of manufacturing the semiconductor device according to claim 4,
wherein each said block forms an array of ultrasonic transducer cells configured to transmit and receive ultrasonic waves.

6. The method of manufacturing the semiconductor device according to claim 1,
wherein the through electrode exposed on the rear surface of the first chip and the wiring layer formed on the front surface of the second chip are electrically connected with each other via a bump.

7. The method of manufacturing the semiconductor device according to claim 1,
wherein, in the step of (d), a portion between blocks which are adjacent to each other is cut.

8. The method of manufacturing the semiconductor device according to claim 1,
wherein, in the step of (d), a portion between columns of said ultrasonic transducer cells arranged in the first direction in each said block is cut.

9. The method of manufacturing the semiconductor device according to claim 1,
wherein a width between each adjacent first chip is equal to or less than 10% of a pitch between adjacent blocks.

10. The method of manufacturing the semiconductor device according to claim 1,
wherein, in a portion between adjacent blocks in the second direction, a compensation region is provided which has a width equal to the width between adjacent ones of said first chips.

11. The method of manufacturing the semiconductor device according to claim 1,
wherein, for each said block, the through electrode is connected with the lower electrode of said block positioned at an end portion of the first chip in the second direction.

12. The method of manufacturing the semiconductor device according to claim 1,
wherein, each said block, the through electrode is connected with the lower electrode of said block positioned at an end portion of the first chip in the first direction.

13. The method of manufacturing the semiconductor device according to claim 1,
wherein, in the step of (d), the plurality of first chips arranged in the second direction are cut from the first semiconductor substrate as a single unit.

14. The method of manufacturing the semiconductor device according to claim 13,
wherein the plurality of first chips cut as the single unit are stacked on the front surface of the second chip.

15. The method of manufacturing the semiconductor device according to claim 1,
wherein, in the step of (d), the first semiconductor substrate is diced using a laser beam.

16. The method of manufacturing the semiconductor device according to claim 1,
wherein the upper electrode of each of said ultrasonic transducer cells has a hexagonal shape.

17. The method of manufacturing the semiconductor device according to claim 16,
wherein, in the step of (d), the first semiconductor substrate is cut along the hexagonal shape of the upper electrode.

\* \* \* \* \*